US011043026B1

(12) United States Patent
Fathi et al.

(10) Patent No.: US 11,043,026 B1
(45) Date of Patent: Jun. 22, 2021

(54) SYSTEMS AND METHODS FOR PROCESSING 2D/3D DATA FOR STRUCTURES OF INTEREST IN A SCENE AND WIREFRAMES GENERATED THEREFROM

(71) Applicant: Pointivo, Inc., Atlanta, GA (US)

(72) Inventors: Habib Fathi, Atlanta, GA (US); Daniel L Ciprari, Atlanta, GA (US); Bradden J Gross, Atlanta, GA (US)

(73) Assignee: POINTIVO, INC., Atlanta, GA (US)

( * ) Notice: Subject to any disclaimer, the term of this patent is extended or adjusted under 35 U.S.C. 154(b) by 389 days.

(21) Appl. No.: 15/881,795

(22) Filed: Jan. 28, 2018

Related U.S. Application Data

(60) Provisional application No. 62/451,700, filed on Jan. 28, 2017.

(51) Int. Cl.
*G06T 17/20* (2006.01)
*G06F 30/13* (2020.01)
*G06T 17/05* (2011.01)
*G06N 20/00* (2019.01)

(52) U.S. Cl.
CPC ............. *G06T 17/20* (2013.01); *G06F 30/13* (2020.01); *G06N 20/00* (2019.01); *G06T 17/05* (2013.01); *G06T 2207/20081* (2013.01)

(58) Field of Classification Search
CPC ..................... G06T 17/20; G06T 17/05; G06T 2207/20081; G06F 30/13; G06N 20/00
USPC .......................................................... 703/2
See application file for complete search history.

(56) References Cited

U.S. PATENT DOCUMENTS

| 7,752,018 | B2 | 7/2010 | Rahmes et al. |
| 8,078,436 | B2 | 12/2011 | Pershing et al. |
| 8,145,578 | B2 | 3/2012 | Pershing et al. |
| 8,170,840 | B2 | 5/2012 | Pershing |
| 8,209,152 | B2 | 6/2012 | Pershing |
| 8,401,222 | B2 | 3/2013 | Thornbery et al. |

(Continued)

OTHER PUBLICATIONS

Ying-Tsung Li, Practical Papercraft Models from Meshes, 2008, Doctoral dissertation, 44 pages.*

(Continued)

*Primary Examiner* — Juan C Ochoa
(74) *Attorney, Agent, or Firm* — Thomas | Horstemeyer, LLP

(57) ABSTRACT

The inventions herein relate generally to improvements in the generation of wireframe renderings derived from 2D and/or 3D data that includes at least one structure of interest in a scene. Such wireframe renderings and similar formats can be used in, among other things, 2D/3D CAD drawings, designs, drafts, models, building information models, augmented reality or virtual reality, and the like. Measurements, dimensions, geometric information, and semantic information generated according to the inventive methods can be accurate in relation to the actual structures. The wireframe renderings can be generated from a combination of a plurality of 2D images and point clouds, processing of point clouds to generate virtual/synthetic views to be used with the point clouds, or from 2D image data that has been processed in a machine learning process to generate 3D data. In some aspects, the wireframe renderings are accurate in relation to the actual structure of interest, automatically generated, or both.

16 Claims, 2 Drawing Sheets

(56) References Cited

U.S. PATENT DOCUMENTS

| | | | |
|---|---|---|---|
| 8,515,125 | B2 | 8/2013 | Thornberry et al. |
| 8,542,880 | B2 | 9/2013 | Thornberry et al. |
| 8,670,961 | B2 | 3/2014 | Pershing et al. |
| 8,818,770 | B2 | 8/2014 | Pershing |
| 8,825,454 | B2 | 9/2014 | Pershing |
| 8,897,539 | B2 | 11/2014 | Stone et al. |
| 8,938,090 | B2 | 1/2015 | Thornberry et al. |
| 8,977,520 | B2 | 3/2015 | Stephens et al. |
| 8,983,806 | B2 | 3/2015 | Labrie et al. |
| 9,070,018 | B1 | 6/2015 | Ciarcia et al. |
| 9,135,507 | B2 | 9/2015 | Chen et al. |
| 9,135,737 | B2 | 9/2015 | Pershing |
| 9,147,287 | B2 | 9/2015 | Ciarcia |
| 9,159,164 | B2 | 10/2015 | Ciarcia |
| 9,183,538 | B2 | 11/2015 | Thornberry et al. |
| 9,244,589 | B2 | 1/2016 | Thornberry et al. |
| 9,329,749 | B2 | 5/2016 | Thornberry et al. |
| 9,384,398 | B2 | 7/2016 | Chen et al. |
| 9,460,517 | B2 | 10/2016 | Fathi et al. |
| 9,514,568 | B2 | 12/2016 | Pershing et al. |
| 9,582,932 | B2 | 2/2017 | Merwe et al. |
| 9,911,228 | B2 | 3/2018 | Pershing et al. |
| 9,959,581 | B2 * | 5/2018 | Pershing ............ G06Q 10/10 |
| 10,037,464 | B2 | 7/2018 | Schultz et al. |
| 10,089,530 | B2 | 10/2018 | Loveland et al. |
| 2009/0232388 | A1 | 9/2009 | Minear et al. |
| 2014/0133698 | A1 * | 5/2014 | Fernandez ......... G06K 9/00805 382/103 |
| 2014/0278697 | A1 | 9/2014 | Thornberry et al. |
| 2016/0239976 | A1 * | 8/2016 | Fathi .................. G06T 7/579 |
| 2016/0292868 | A1 | 10/2016 | Hu et al. |
| 2017/0236024 | A1 | 8/2017 | Wang et al. |
| 2017/0316115 | A1 | 11/2017 | Lewis et al. |
| 2018/0247383 | A1 | 8/2018 | Pershing |
| 2018/0247416 | A1 | 8/2018 | Ruda et al. |
| 2018/0336722 | A1 | 11/2018 | Pershing et al. |
| 2019/0236839 | A1 * | 8/2019 | Fathi .................. G06T 17/05 |

OTHER PUBLICATIONS

Maja et al., Some Surfaces of Second Order as Examples of Webers Surfaces, 2015, Journal of Industrial Design and Engineering Graphics 10(2), pp. 55-60.*

Krivoshapko and Gbaguidi-Aisse, "Geometry, static, vibration and bucking analysis and applications to thin elliptic paraboloid shells", 2016, The Open Construction and Building Technology Journal 10.1, pp. 576-602.*

Zhang et al., "Detecting, fitting, and classifying surface primitives for infrastructure point cloud data", 2013, Computing in Civil Engineering, 8 pages.*

Jung et al., "Automated 3D wireframe modeling of indoor structures from point clouds using constrained least-squares adjustment for as-built BIM", 2016, Journal of Computing in Civil Engineering 30.4: 04015074, pp. 1-15.*

Guangcong Zhang, From Images To Augmented 3d Models: Improved Visual SLAM and Augmented Point Cloud Modeling, 2015, Diss. Georgia Institute of Technology, 151 pages.*

Fischer et al. "Extracting Buildings from Aerial Images using Hierarchical Aggregation in 2D and 3D". Computer Vision and Image Understanding. vol. 72 (Nov. 1998) 30 pages.

Milde et al. "Graph-based Modeling of Building Roofs". 12th AGILE International Conference on Geographic Information Science (Jun. 2009) 5 pages.

Nguatem et al. "Automatic Generation of Building Models with Levels of Detail 1-3" The International Archives of the Photogrammetry, Remote Sensing and Spatial Information Sciences, vol. XLI-B3, XXIII ISPRS Congress, 12-19 (Jun. 2016) 7 pages.

Huang et al. "3D Building Roof Reconstruction from Point Clouds via Generative Models" Conference Paper. (Nov. 2011) 11 pages.

Dorninger et al. "A Comprehensive Automated 3D Approach for Building Extraction, Reconstruction, and Regularization from Airborne Laser Scanning Point Clouds" Sensors, vol. 8 (Nov. 2008) pp. 7323-7343.

Xu et al. "HRTT: A Hierarchical Roof Topology Structure for Robust Building Roof Reconstruction from Point Clouds" Remote Sens., vol. 9, Issue 354 (Apr. 2017) 23 pages.

Schindler et al. "A Model-Based Method for Building Reconstruction" Conference Paper. (Nov. 2003) 10 pages.

Rottensteiner et al. "Automatic Generation of Building Models from Lidar Data and the Integration of Aerial Images" ISPRS, vol. XXXIV (Jan. 2003) 8 pages.

Zheng et al. "A Hybrid Approach for Three-Dimensional Building Reconstruction in Indianapolis from LiDAR Data" Remote Sens., vol. 9, Issue 310 (Mar. 2017) 24 pages.

Huang et al. "A Generative Statistical Approach to Automatic 3D Building Roof Reconstruction from Laser Scanning Data" Remote Sens., vol. 79 (May 2013) pp. 29-43.

Edelsbrunner et al. "Constructive Roofs from Solid Building Primitives". Trans. Computational Science XXVI (Jan. 2016) pp. 17-40.

Jarzabek-Rychard et al. "3D building reconstruction from ALS data using unambiguous decomposition into elementary structures". Remote Sens., vol. 118 (Aug. 2016) pp. 1-12.

* cited by examiner

SYSTEMS AND METHODS FOR PROCESSING 2D/3D DATA FOR STRUCTURES OF INTEREST IN A SCENE AND WIREFRAMES GENERATED THEREFROM

CROSS-REFERENCE TO RELATED APPLICATIONS

This application claims priority to U.S. Provisional Application No. 62/451,700 filed Jan. 28, 2017. The contents of that application is incorporated by reference herein in its entirety.

STATEMENT OF GOVERNMENT INTEREST

This invention was made with government support under contract numbers 1519971 and 1632248 awarded by the National Science Foundation. The Government has certain rights to the invention.

FIELD OF THE INVENTION

The inventions herein relate generally to improvements in the generation of wireframe renderings derived from 2D and/or 3D data that includes at least one structure of interest in a scene. Such wireframe renderings and similar formats can be used in, among other things, 2D/3D CAD drawings, designs, drafts, models, building information models, augmented reality or virtual reality, and the like. Measurements, dimensions, geometric information, and semantic information generated according to the inventive methods can be accurate in relation to the actual structures. The wireframe renderings can be generated from a combination of a plurality of 2D images and point clouds, processing of point clouds to generate virtual/synthetic views to be used with the point clouds, or from 2D image data that has been processed in a machine learning process to generate 3D data. In some aspects, the wireframe renderings are accurate in relation to the actual structure of interest, automatically generated, or both.

BACKGROUND OF THE INVENTION

Digital three dimensional ("3D") building models, such as wireframe renderings, are increasingly used for diverse tasks in architecture and design such as construction planning, visualization, navigation, simulation, facility management, renovation, and retrofitting. To this end, 3D data relating to objects, structures, or elements in a scene, such as point clouds, have utility in a variety of applications. As one example, when manipulated to generate a wireframe rendering, 3D data in the form of point clouds can be used in CAD systems, building information model ("BIM") systems, A/R ("augmented reality") or V/R ("virtual reality") or the like. For example, point clouds generated from LiDAR techniques have typically been used as a starting point for generating 3D models for use in various engineering-type applications. However, current methodologies do not readily allow 3D data derived from structures, objects, or elements in a scene to be automatically processed to generate wireframe renderings that are accurate in relation to the structure or object for which the renderings are being generated. In this regard, while computer vision technology has been advancing quickly in recent years, the effectiveness and quality of algorithms and techniques to extract information from imaging of structures (or objects etc.), such as buildings, has not progressed to ensure high quality results can be obtained using automatic methods, especially when the structure is even modestly complex in form. Existing algorithms used to analyze and extract wireframe renderings in suitable detail from 3D data, such as point clouds, are often unable to fully resolve the geometric features for structures, objects, or elements present in a scene without also an attendant manual evaluation and/or manual manipulation of the output. This means that existing algorithms are incapable of automatically generating high quality reconstructions for many structures and/or objects that are of interest.

Lack of accurate wireframe renderings from 3D data using automatic methods is particularly acute when the structure being modeled from 3D data is from a time that building designs were generated using non-computer methods because there is likely no design or engineering information retrievable for use as 3D data. This is a category that includes the vast majority of buildings in the world. To generate high quality wireframe renderings of such structures such that they can be used for engineering-related applications, such as repair and rehabilitation, time consuming manual activities must be conducted.

Another problem faced in generation of accurate wireframe renderings from 3D data is when a structure or object is "arbitrary," in that it is non-standard and/or has not previously been analyzed in the same context. Such arbitrary structures or objects will therefore not have accurate baseline information retrievable in an available library of structural elements or other relevant information to provide reference for automatic generation of accurate wireframe renderings. To obtain high quality wireframe renderings for these arbitrary structures or objects, human supervision via manual interventions is required. Cost and complexity of creating high quality wireframe renderings for objects that are being examined for the first time is therefore high today, due to the requirement that manual interventions be conducted in order to generate high quality wireframe renderings using current state of the art methodology.

An overview of prior art methodologies and the shortcomings in the specific context of building model generation are highlighted in the recent article "A Hybrid Approach for Three-Dimensional Building Reconstruction in Indianapolis from LiDAR Data," Remote Sens., 9, Mar. 2017, 310. This publication outlines three existing approaches to modeling of buildings using 3D data generated from LiDAR, the contours of which can generally be applied to modeling of objects other than buildings and 3D data derived from sources other than LiDAR. To summarize this discussion, building modeling generally includes two steps: 1) the detection of building boundaries from 3D data; and 2) the reconstruction of building models from such data. For "data-driven" (also called "bottom-up") methodologies, buildings are considered to be an aggregation of roof planes represented in the point clouds followed by processing via segmentation using one or more of a variety of algorithms such as, region growing, RANSAC, clustering, or ridge or edge based. For model-driven (also called "top-down") approaches, parametric building models are generated and stored to generate 3D models or wireframes from the point clouds. The data-driven approach has the advantage of detecting basic elements of the building, but the quality of 3D modeling or wireframe generation can be limited by the algorithm applied for segmentation. Automatic 3D modeling or wireframe generation is nonetheless problematic when small features are present in the structure and/or substructures are contained within larger structures. The model-driven approach has the advantage that, for roof 3D modeling or wireframe generation, the various facets are standardized, which improves 3D modeling or wireframe generation quality. However, the model-driven approach requires that the needed model element is stored in the library, which makes not standard roof or non-ideal 3D modeling or wireframe generation problematic.

A "hybrid approach" is a combination of the data-driven and model-driven approaches. This methodology first generates the features of the structure of interest using algorithms as discussed previously, followed by application of previously generated models to provide the 3D building information, for example, in the form of a wireframe rendering. While the hybrid approach can produce greater wireframe quality than use of either the data-driven or model-driven approaches individually, the inherent problems in each of the approaches (e.g., algorithm quality and library limitations) nonetheless reduce the overall 3D modeling and wireframe rendering quality of these methods. While the hybrid approach has been applied using automatic methods with some success for simple structures where simple building structures are applicable and for which pre-defined building primitives can be applied, for structures and objects that where non-planar and/or a plurality of planar building features are present, wireframe renderings that do not require at least some manual interaction and/or manual result validation remain elusive.

As shown, significant progress remains to be made in the generation of wireframe renderings for buildings, and other structure types, as well as for the generation of wireframe renderings for other object types. In this regard, while some percentage of buildings are likely to comprise at least some standard features (e.g., roof parts, windows, doors, etc.), many buildings comprise non-standard features or complex arrangements of standard features (e.g., multi-faceted roof structures) that will be difficult to accurately resolve due to the complexity of the arrangements therein. Further, non-building structures in a scene are more likely to comprise non-standard components or otherwise be arbitrary. Accordingly, current state of the art methodologies cannot suitably generate accurate wireframe renderings for such structures and objects without manual intervention in the generation of the 3D information and/or manual validation of the results thereof.

Moreover, even for wireframe renderings that are generated with at least some human supervision, that is, are not generated fully automatically, there remains a need for accurate measurements, dimensions, geometric information, topological information, semantic information, and the like, where such accurate measurements etc. are close in value, or even substantially equivalent to, those for the actual structures or objects. It follows that it would be even better to be able to generate such accurate measurements etc. automatically.

There remains a need for improvements in methods to generate wireframe renderings from 3D data associated with structures of interest in a scene, where such structures comprise buildings, parts of buildings, or other objects. The present invention provides these and other benefits.

SUMMARY OF THE INVENTION

The present invention relates to systems and methods for generating wireframe renderings of one or more structures of interest in a scene. The structure of interest optionally comprises at least one non-planar surface. The wireframe renderings can be generated automatically. The wireframe renderings can be accurate in relation to the actual structure(s) of interest in the scene. Still further, the wireframe renderings can be automatically generated and accurate in relation to the actual structure(s) of interest in the scene.

In accordance with implementations of the present inventions, 2D and 3D data is provided for at least one structure of interest. The 2D and 3D data can comprise, for example, a plurality of 2D images including the at least one structure of interest and at least one point cloud including the at least one structure of interest, wherein the plurality of 2D images are associated with the at least one point cloud. Yet further, the 2D and 3D data can comprise, for example, 2D data generated from the processing a plurality of point clouds that incorporate the at least one structure of interest. Such 2D and 3D data is processed to generate 3D data comprising boundary information associated with the structure. From such processed information, at least one geometric primitive is extracted therefrom, where the extracted geometric primitive(s) are selected from a specific list as set out in Table 1 hereinafter. From the at least one extracted geometric primitives, a wireframe rendering of at least part of the structure of interest in the scene is provided. Yet further, at least two geometric primitives can be extracted from the processed information, wherein all or part of the first geometric primitive is within the second geometric primitive boundary. Still further, a plurality of geometric primitives can be extracted from the processed 3D information, and the plurality of geometric primitives can be combined to generate the wireframe rendering.

The generated wireframe renderings can be input into a machine learning training set associated with a library of information relevant to the structure of interest. Information associated with the library of information can be used in subsequent wireframe generation processes.

The types of structures of interest that can be used with the inventions herein are expansive. For example, the structures can comprise building exteriors or interiors. The structure of interest can comprise a roof. In this regard, the wireframe rendering can be used, for example, in a roofing report. Yet further, the generated wireframes can be used in, among other things, 2D/3D CAD drawings, designs, drafts, models, building information models, augmented reality or virtual reality, and the like.

In a further aspect, wireframe renderings of the at least one structure of interest can be generated directly from 2D data incorporating the structure of interest in a scene without first generating a point cloud as an interim step. In this aspect, machine learning models and computer vision techniques are utilized to generate 3D data from which wireframe renderings can be generated using substantially only images and/or camera parameters derived from the 2D images.

Additional advantages of the invention will be set forth in part in the description that follows, and in part will be apparent from the description, or may be learned by practice of the invention. The advantages of the invention will be realized and attained by means of the elements and combination particularly pointed out in the appended claims. It is to be understood that both the foregoing general description and the following detailed description are exemplary and explanatory only and are not restrictive of the invention, as claimed.

DETAILED DESCRIPTION OF THE INVENTION

Figure 1:
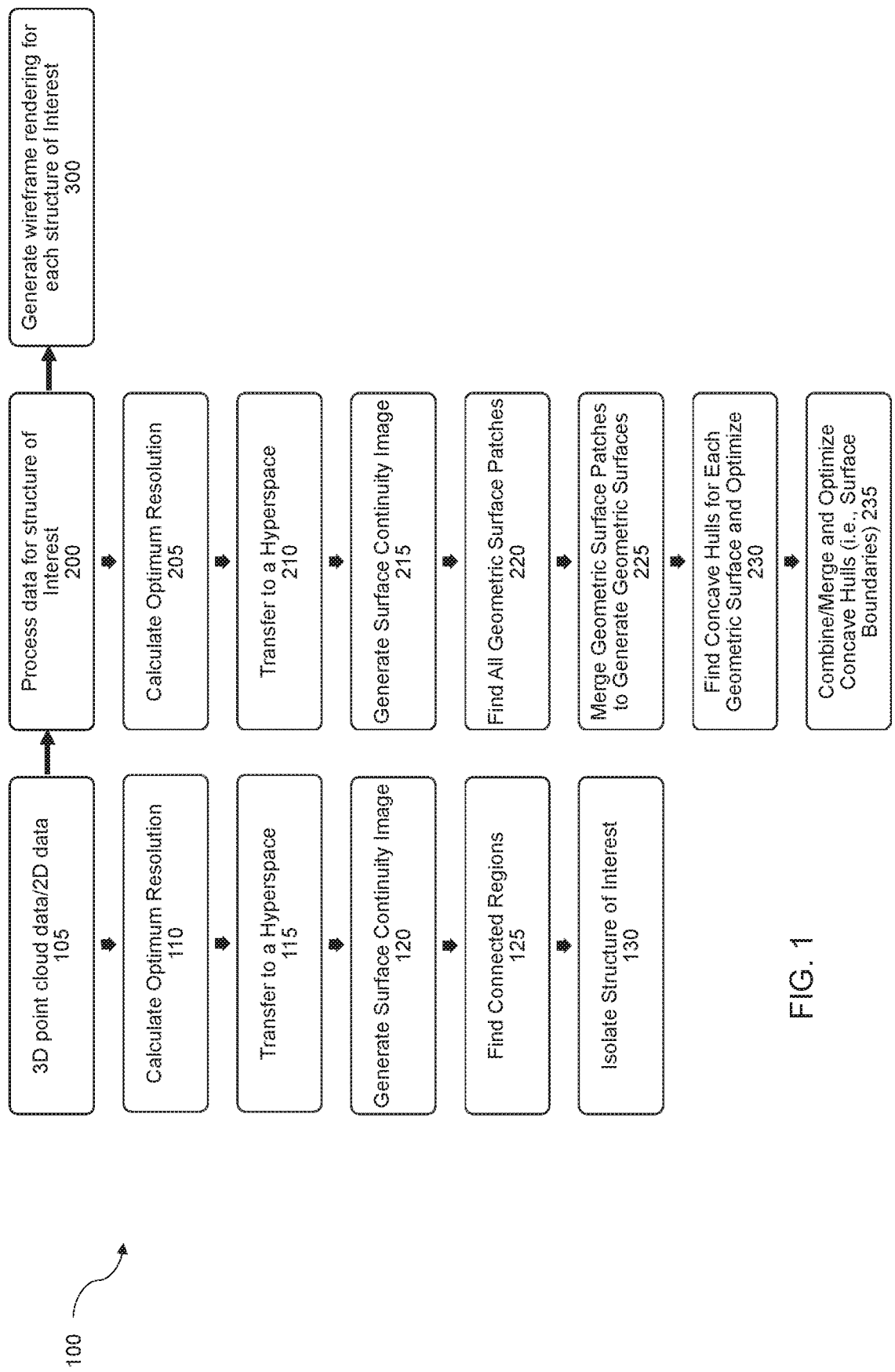
FIG. 1 illustrates an exemplary process for generating wireframe renderings from 2D and 3D data incorporating a structure of interest.

Many aspects of the disclosure can be better understood with reference to the Figures presented herewith. The Figures are intended to illustrate the various features of the present disclosure. While several implementations may be described in connection with the included drawings, there is no intent to limit the disclosure to the implementations disclosed herein. To the contrary, the intent is to cover all alternatives, modifications, and equivalents.

The term "substantially" is meant to permit deviations from the descriptive term that do not negatively impact the intended purpose. All descriptive terms used herein are implicitly understood to be modified by the word "substantially," even if the descriptive term is not explicitly modified by the word "substantially."

The term "about" is meant to account for variations due to experimental error. All measurements or numbers are implicitly understood to be modified by the word about, even if the measurement or number is not explicitly modified by the word about.

"2D data," in one aspect, are derived from image data as described hereinafter. Briefly, 2D image data can be derived from image capture devices, for example. In another aspect, 2D data is generated in the form of virtual views derived from point clouds are discussed hereinafter.

"3D data" means raw data such as 3D point clouds, or mesh or vector files. 3D data comprising information regarding structures or objects of interest in a scene can be directly generated from active scanning technologies such as LiDAR, laser scanners, time-of-flight cameras, PMD (Photonic Mixer Device) cameras, depth-sensing cameras, and the like. 3D data in the form of point clouds can also be obtained from stereovision photogrammetry using two passive image capturing devices. More recently, passive single vision photogrammetry, which can be obtained from regular or video imaging techniques, has been disclosed to create point clouds, as described in U.S. Pat. No. 9,460,517 (the "'517 patent"), the disclosure of which is incorporated by reference herein in its entirety. More detailed discussion of the manners in which the 3D data can be generated for use herein is set out herein below.

3D data useable in the processes herein can also be derived from 2D data in an inventive methodology where a plurality of 2D images incorporating the structure or object of interest are processed via the application of computer vision techniques, machine learning techniques, or the like. In this way, information about geometry, objects of interest, interaction of objects in a scene, and their semantic information can be determined in 3D space using only 2D data. As a non-limiting example, multiple 2D images including the same object of interest in the scene from two or more different viewpoints or perspectives, such as a window, can be triangulated into 3D space and represented with size and distance relationships to one or more other objects present in the scene. Using such processes that can operate to impart special and dimensional characteristics to structures or objects present in 2D images, 3D data can be created for use in the inventive processes herein. Accordingly, a form of 3D data for use in the invention can be synthesized from 2D image data, in a significant context. More detail about such methodology is provided hereinafter.

As used herein, a "wireframe rendering" refers to one or more of a visual, abstract, data-interchange, human-readable, machine-readable, text-based, and/or object-based 3D representation of a physical object. This 3D representation can be created by specifying each edge of the physical object where two mathematically continuous smooth surfaces meet, or by connecting an object's constituent vertices using straight lines or curves. In other words, the wireframe rendering can be an edge or skeletal representation of a real-world object which consists of points, lines, arcs, circle, and other curves that define the edges or center lines of objects. Still further a wireframe rendering can also be defined as any combination of representations of a structure, object etc. of a collection of surface boundaries, points of interest in 2D or 3D, line segments in 2D or 3D, and/or lines connecting points of interest in 2D or 3D, generated from a structure of interest in a scene. A wireframe rendering can be part of or useable in the context of one or more of 2D/3D CAD drawings, designs, drafts, models, A/R, V/R of one or more structures of interest in a scene. In an illustrative example, according to these definitions, a 3D wireframe rendering could be used to generate basic 3D designs for evaluation and fast design iterations, to view the model from any viewpoint, to analyze spatial relationships including the distances between corners and edges as well as checking visually for potential interferences, to generate perspective views, to generate standard orthographic and auxiliary views automatically, and to act as reference geometry for 3D solid, surface, mesh modeling. In further examples, a wireframe rendering can include an object-based representation of a real-world scene in which each object in the scene represents a data structure that comprising information about all or part of the geometry, topology, and semantic attributes of an object. This object-based representation is typically referred to as "BIM" and could have multiple levels of development (LOD) depending on the level of details that are stored in the object data structure.

The term "wireframe rendering" may be used herein to have the same meaning as "wireframe," in some contexts.

As would be recognized, a surface boundary is a "concave hull" that encapsulates the collection of 3D data points belonging to a surface. Concave hulls can also be termed as "alpha shapes." A generated wireframe rendering merges and shows overlapping portions or segments of surface boundaries that are derived from a collection of surfaces, wherein such overlapping portions are provided in the generated wireframe rendering as a single curve that is shared among all of the intersecting surfaces.

A "structure" as used herein, when presented in the context of the invention herein, can be represented or conceptualized as a collection of features in the form of surfaces having boundaries. In accordance with the inventive methodology herein, in some aspects, each of the surfaces in a collection of surfaces can, independently, be extractable as one of several forms of mathematically defined "geometric primitives," as such several forms are described in more detail hereinafter in relation to Table 1. These geometric primitives have boundary information from which wireframe renderings can be derived.

As used herein, a "scene" is a location that can incorporate one or more structures of interest.

A "structure of interest" can encompass a wide variety of structures (that also may be referred to in some contexts as "objects" or "elements") that may be present in a scene such as, for example, components of a building (e.g., doors, windows, walls, roofing, façade, stairs, plumbing/piping, electrical equipment, floors, flooring material, decorative aspects), landscape components, and the like. Indeed, a "structure of interest" can be anything from which 3D data suitable for processing into wireframe renderings can be derived. Further, the methodology herein can be utilized to extract information about more than one structure of interest in a scene, such as two different structures (e.g., a door and a window); or a collection of smaller structures—or "sub-structures/elements" (e.g., doors, windows, etc.)—associated with a larger structures (e.g., all or part of a building) where information about such collection of smaller and larger structures can be processed into one or more wireframe renderings according to the inventive methodology herein.

The definition of "structure" is meant to be expansive to include any element or feature present in a scene that might be relevant to a user. For example, a scene can include one or more structures of interest, where the scene comprises an exterior location. The structures in the scene can comprise, for example, doors, windows, roofs, facades, landscape elements, etc. Each of these structures can be comprised of sub-structures/elements, such as panes in a window, or a door knob or a kick plate on a door. In a further example, a pitched roof on a house can comprise a structure of interest, and/or the various sub-parts of the roof can also comprise a plurality of structures of interest or sub-structures/elements of interest in conjunction with the entire roof structure (e.g., skylights, "eyebrows" etc.). In some aspects, wireframe renderings generated from the scene can incorporate only part of the overall structure, such as part of a roof. Such partial structure information as provided in the wireframe rendering may nonetheless be suitable for use in one or more applications.

In another non-limiting example, a scene can comprise one or more structures of interest located in the interior of a building or facility, where the one or more structures can comprise walls, floors, mechanical equipment, windows, doors, doorways, furniture (e.g., chairs, tables, etc.), fixtures (e.g., lighting, cabinets, flooring), computers, electronic equipment, inventoriable items regardless of size, value etc. Each of these structures can comprise sub-structures/elements. For example, when the structure of interest is an HVAC system, sub-structures of interest may include the mechanical components (e.g., compressor, air exchanger etc.), duct work, and the like, all or some of which can be incorporated in one or more wireframes, as set out in more detail herein.

In some aspects, each of the surfaces or each of the surface boundaries for the structure of interest derived from the 2D and/or 3D data can be incorporated into one or more wireframe renderings. In other aspects, only some of the surfaces or some of the surface boundaries for the structure of interest can be incorporated into one or more wireframe renderings. In some aspects, only one of the surfaces or surface boundaries of one or more structures may be of interest. As such, the generated wireframe rendering may comprise information about all or only part of a structure of interest.

"A least part of" in reference to the one or more structures of interest refers to an instance where only a portion or portions but not the entire structure is incorporated in the generated wireframe. In some aspects, the present invention can be utilized to generate information about structures of interest that may be present or partially present in a scene, as desired by a user. An example of when "at least part of" is present in a scene can include instances where the structure, and therefore any surfaces and surface boundaries associated therewith, is only partially captured for generation into a wireframe, due to occlusion or the perspective of the image capture device or where parts of the structure fit into the scene but the entirety of the structure does not.

In broad aspects, the present invention provides methods to generate wireframe renderings for one or more structures of interest in a scene from 3D data and/or 2D data that includes the structure of interest, where the structure optionally comprises at least one non-planar element therein. The 3D and/or 2D data are processed to generate 3D data comprising boundary information for the structure, where this generated 3D data having boundary information is associated with the structure of interest. Next, at least one geometric primitive is extracted from the generated 3D data having boundary information, where each of the geometric primitives extracted therefrom are each, independently, selected from the list of Table 1.

TABLE 1

| No. | Type | Canonical Expression |
|---|---|---|
| 1 | One real plane | $ax + by + cz + d = 0$ |
| 2 | Ellipsoid | $x^2/a + y^2/b + z^2/c = 1$ |
| 3 | Elliptic cylinder | $x^2/a + y^2/b = 1$ |
| 4 | Hyperbolic cylinder | $x^2/a - y^2/b = 1$ |
| 5 | Parabolic cylinder | $x^2 + 2y = 0$ |
| 6 | Quadric cone | $x^2/a + y^2/b - z^2/c = 0$ |
| 7 | Hyperboloid of one sheet | $x^2/a + y^2/b - z^2/c = 1$ |
| 8 | Hyperboloid of two sheets | $x^2/a + y^2/b - z^2/c = -1$ |
| 9 | Hyperbolic paraboloid | $x^2/a - y^2/b + 2z = 0$ |
| 10 | Elliptic paraboloid | $x^2/a - y^2/b + 2z = 0$ |
| 11 | Intersecting planes | $x^2/a - y^2/b = 0$ |
| 12 | Parallel planes | $x^2 = 1$ |

3D data used in the extraction of the listed geometric primitives incorporates information about the structure(s) of interest, such as, in non-limiting examples, vertices, line segments, connections between objects of interest, edges, surfaces and surface boundaries of all or part of one or more structures of interest.

In some aspects, the wireframe renderings are generated about the structure of interest automatically, that is, without human intervention or manual manipulation by a user. In other aspects, the wireframe renderings are generated about the structures of interest substantially automatically. In further aspects, the wireframe renderings are generated in a plurality of steps, wherein at least one of the steps is conducted without human supervision or the need for a human to manipulate or validate the output of those steps or a collection of steps. Still further, the wireframe renderings are generated in a plurality of steps, wherein all of the steps are conducted without human supervision or the need for a human to manipulate or validate the output of those steps or a collection of steps.

Wireframe renderings of the one or more structures of interest can incorporate a selection step whereby the structure(s) of interest or parts of the structures of interest are selected (or identified) from the scene or from a collection of other structures that may be present in the scene. Such selection/identification can be performed automatically by a computer, by a user, or both by a computer and a user. Alternatively, the structure that is not of interest or part of the structure that is not of interest can be deselected. Such selection or deselection can be done automatically by the computer, manually by a user, or both automatically or manually.

In some aspects, the present invention allows one or more structures of interest or part of one or more structures present in a scene to be rendered as wireframes substantially in a single, automatic, operation. Such wireframe renderings are accurate models of the structure of interest as well as, in some aspect, numerically accurate. "Model accuracy" means that the wireframe rendering comprises the same structural element and is recognizable as the object type as is the actual structure of interest in the scene. "Numerical accuracy" means that any numerical values derivable from the 3D information are close in value to the actual numerical values for the object of interest in the scene. Yet further, "accuracy" in relation to the invention herein means that one or more of the measurement, dimension, geometric information, topological information, semantic information, and labeling (that is, identification) is substantially equivalent to the actual (that is, real life) measurements, dimensions, geometry, topology, semantic information and labeling information for the actual object in the scene. In this regard, the structure of interest in a scene will have an actual/real-life attribute, and the information generated from the methodology herein will be substantially the same as the actual/real-life attribute. When the information returned is numerical in nature (e.g., measurement, dimension, geometry information) the value(s) returned from the methodology herein will be within about 5% or about 1% or about 0.1% or closer to the actual value. (Such numerical accuracy is discussed in more detail hereinafter.) When the information returned is a label, topological relationship, or the like, the returned information will be the same (e.g., a returned label of a "chair" will correctly identify a chair as being present in the scene).

As noted previously, the prior art comprises data-driven, model-driven, and hybrid approaches to the generation of wireframe renderings from 3D data generated from structures such as roofs, buildings, etc. Currently, model-driven or hybrid approaches are used for wireframe generation because data-driven approaches used alone are not able to generate accurate results. In the non-limiting case of a roof, prior art model-driven methodologies cannot consistently generate accurate wireframe renderings of the roof or structure without substantial manual interaction. This is due at least to the fact that, when generating wireframes regarding structures of interest that comprise one or a plurality of surfaces, the frameworks of analysis primarily focus on a model-driven approach that applies a library of previously defined and retrievable information identified as being pertinent to the structure being reconstructed, namely, a library of roof primitives, solid building primitives, pre-defined roof shapes, or description of roofs using a formal grammar. Put simply, the prior art assumes that the necessary shapes—that is, the "high-level geometric primitives" referenced in the prior art—are available to be defined in the data generated from the structures to generate an accurate wireframe rendering of that roof. For complex roofs and non-standard roofs and buildings—or more broadly structures of interest in a scene having complexity—accurate wireframe renderings cannot be generated therefrom unless some form of human supervision is applied during the generation or for validation, without such human supervision, errors will commonly result because the necessary shapes to successfully generate each of the pieces to generate an accurate model are not available in the pre-defined library. Accordingly, with prior art model-driven methods, the resulting wireframe renderings typically must be reviewed by a human one or more times during the generation thereof. If necessary, the generated wireframe rendering must be corrected or adjusted to allow the wireframes rendered therefrom to comprise information suitable for use.

In significant aspects, the present invention allows geometrically, dimensionally, topologically, and semantically accurate wireframes to be generated directly from 2D and/or 3D data incorporating one or more structures of interest in a scene. In further aspects, the inventive wireframe renderings can be generated substantially without the need for a manual wireframe validation and/or correction step. In some aspects, a validation step can optionally be conducted, where such validation step can be done automatically, such as by use of information derived from machine learning processes as discussed hereinafter.

In some cases, 3D data, such as point clouds, and 2D image data incorporate the structure of interest can further incorporate a structure that is not of interest. For example, 3D data may include a building as a structure of interest and a tree that partially occludes the building. 2D image data associated therewith, such as image data from which the point clouds are derived, will also comprise such occlusions. In substantial aspects, the generated wireframe rendering will comprise substantially only aspects, components, or features associated with each of one or more structures of interest in the scene. In other aspects, the wireframe renderings generated herein will substantially exclude information about structure(s) present in the scene that are not of interest, such as the tree in this example.

In various aspects, the inventive methodology herein is able to extract, resolve, isolate, or segment the respective surfaces for the structures of interest from other surfaces in the scene that are not part of the structure of interest. In this regard, the present inventive methodology can, for example, allow an accurate wireframe rendering to be extracted for all or part of each of the structures of interest even when at least part of the 2D and/or 3D data incorporates data about a structure or object not of interest that at least partially occludes the structure of interest. As an implementation of this inventive methodology, a substantially accurate wireframe rendering can be provided of a roof, where such wireframe consists substantially only of boundary information associatable with the roof aspects present in the actual roof in the scene. Yet further, the generated wireframe will substantially exclude surfaces, lines, and vertices that are not part of the structure of interest. In some aspect, such exclusion can be done automatically and without the need for manual operation by a human operator.

The wireframe renderings generated according to the inventive methodology are substantially accurate because they allow measurements or other dimensional information to be derived from the generated wireframes that have less than about 5% or less than about 2% or less than about 1% or less than about 0.1% or less than about 0.01% deviation from the measurements, dimensions, and geometry of the actual (e.g., "real life") structure of interest. In this regard, at least accurate length, width, surface area, and volume measurements can be obtained. For example, if a roof section on a house has a length of 50 feet, the generated wireframe section corresponding to that roof length will be generated as ranging in length of about 45 to about 55 feet, or from about 47.5 to about 52.5 or from about 49 to about 51 feet or from about 49.5 to about 50.5 feet or even less for very accurate measurements. Similarly, the dimensions of each of the various roof sections can be calculated to thereby provide an accurate surface area of the roof, such as within about 5% or about 2% or about 1% or about 0.1% or even or less than the actual surface area of the roof.

In some aspects, the wireframe renderings generated according to the inventive methodology are also substantially accurate because they allow for counting and grouping of like items together where such counting and/or grouping are correct in relation to the real-life items. For example, if a structure has multiple roof facets or material types, labels returned for those aspects will conform to each of the roof facets or each of the material types, as well as generating the measurement information as discussed previously. For the case of multiple windows, the information generated from the methodology herein can provide the location of each individual window, the count of total windows, the surface area of each window, the total surface area of all windows, and/or the sections of the structures which contain a window. Such labeling information can be included on a wireframe rendering, and further may be provided for use in other output forms, such as roofing reports, etc. Roofing reports are described, for example, in one or more of U.S. Pat. Nos. 8,078,436; 8,145,578; 8,170,840; 8,209,152; 8,515,125; 8,825,454; 9,135,737; 8,670,961; 9,514,568; 8,818,770; 8,542,880; 9,244,589; 9,329,749; 8,938,090 and 9,183,538, the disclosures of which are incorporated by reference herein in their entireties.

In significant aspects, the one or more structures of interest in the scene each, independently, include surfaces having surface boundaries that can be represented as one or a plurality of primitive geometries as set out in previous Table I. One or a variety of the listed geometric primitives can typically be extracted (or resolved or isolated) from the processed 3D and/or 2D data derived from the structure of interest to generate wireframe renderings according to the methodology herein. That is, 3D and/or 2D data derived from each of the one or more structures of interest can be processed to generate 3D data having at least one extractable geometric primitive of Table I from which a wireframe rendering can be generated. When the structure of interest comprises a plurality of surfaces from which a plurality of the geometric primitives of Table I can be extracted from processed 3D data having boundary information, such geometric primitives can be the same or different. Yet further, a plurality of extracted geometric primitives of Table I can be combined to generate a wireframe rendering for a multi-dimensional structure of interest.

By way of explanation, the inventive methodology is a significant departure from existing paradigms used for wireframe rendering. Instead of fitting externally generated geometric building primitives (i.e., high-level geometric primitives) or other pre-defined structural library information to processed 3D data (e.g., point clouds) having a structure of interest in a scene incorporated therein, the inventors herein have discovered that it is possible to extract one or more specific low-level geometric primitives from a finite list as set out in Table 1 in from the 3D data having boundary information therein and to extract such primitives to generate wireframe renderings that are accurate in relation to the real-life structure in the scene. Still further, the inventors herein have determined that the finite set of low-level geometric primitives can present all of the necessary mathematical operations (including quadric surface equations) to generate a model of any structure (e.g., building, roof, parts of a building, or any other object of interest) that is included in the 2D and/or 3D data that is generated and processed according to the methodology herein.

To illustrate the concept of geometric primitive extracted from processed 3D data having boundary information in the present invention, a pitched roof will generally incorporate a plurality of planar surfaces. For scenes in which planar surfaces are present—here a roof—wireframe renderings of the planar sections can be obtained directly from the processed 3D data having boundary information therein.

With regard to the planar sections of a roof, a wireframe rendering can be created by extracting one or a collection of geometric primitives from the 3D data having boundary information therein, where such 3D data is provided in the form of a point cloud, etc. that incorporates 2D data (either derived from a plurality of 2D images or provided in the form of "virtual/synthetic view" data). From this 3D and 2D data, 3D data that comprises boundary information allows one or more of the listed geometric primitives to be extracted (or isolated or resolved or segmented) to allow wireframe renderings to be generated.

In a further example, a wireframe rendering can be generated by extracting information from only 2D images, without the necessity to first generate a point cloud, wherein the extracted 2D information corresponds to the respective boundaries of each edge of the planar sections derivable from the scene. In this implementation, the 2D image data is directed into a machine learning process, as discussed further hereinafter.

In further aspects, fewer geometric primitives than listed Table I, specifically a subset of those listed, can be used to generate the wireframe renderings. In this regard, in some aspects, the geometric primitives extractable from the processed 3D data comprise the list of geometric primitives of Table 2.

TABLE 2

| No. | Type | Canonical Expression |
|---|---|---|
| 1 | One real plane | $ax + by + cz + d = 0$ |
| 2 | Ellipsoid | $x^2/a + y^2/b + z^2/c = 1$ |
| 4 | Hyperbolic cylinder | $x^2/a - y^2/b = 1$ |
| 6 | Quadric cone | $x^2/a + y^2/b - z^2/c = 0$ |

In some aspects, the structure of interest in the scene comprises at least one non-planar element therein, thus providing at least one non-planar surface extractable (or isolatable, or resolvable, or segmentable) therefrom. In further aspects, the structure of interest in a scene optionally comprises at least one non-planar element, thus providing at least one non-planar surface extractable (or isolatable, or resolvable, or segmentable) therefrom. Yet further, the structure of interest comprises at least one substructure that is incorporated within another structure, such as a dormer located within a larger roof structure. Such sub-structure can or can optionally comprise at least one non-planar element, thus providing at least one non-planar surface extractable (or isolatable or resolvable or segmentable) therefrom.

As noted, in some aspects, the structure of interest can comprise at least one non-planar element, thus providing at least one non-planar surface identifiable, isolatable, resolvable, or segmentable therefrom. Accordingly, at least one non-planar geometric primitive, such as one having a quadric functionality, will be extractable (or isolatable or resolvable or segmentable) from the processed 3D data having boundary information. For geometric primitives other than planar forms, that is, the non-planar geometric primitives set out above in Table 1 and Table 2, the generated wireframe rendering will conform to the boundaries of that specific primitive(s) isolatable from the processed 3D data. For example, a geometric primitive of an ellipsoid surface can be extracted (or isolated or resolved or segmented) from the 3D data having boundary information therein in the case of a roof structure that includes a dome shape therein. Still further, a combination of planar and ellipsoid surfaces can be extractable (or isolatable or resolvable or segmentable) as geometric primitives from the processed 3D data to generate a wireframe rendering of a roof structure that includes a plurality of intersecting roof planes and a 3D dome.

As another example of the inventions herein, a concrete girder box bridge could comprise the structure of interest in a scene. Such a bridge could comprise, for example, one or more cylindrical columns, a deck having intersecting planar surfaces, one or more arch surfaces for connecting the columns to the deck, etc. Using the methodology herein, a plurality of the specified geometric primitives from Table 1 is extractable (or isolatable or resolvable or segmentable) from the processed 3D data to generate a wireframe rendering of all or part of the concrete girder box bridge. The present invention provides a previously unavailable methodology to automatically generate a wireframe rendering of complex structures and/or to generate an accurate wireframe rendering, such as this concrete girder box bridge, wherein the structure is considered "complex" at least because it comprises one or a plurality of intersecting quadric surface forms.

By way of distinction from the prior art in one aspect, the inventive wireframe generation process can be considered to be in the first order a "data-driven" methodology as opposed to a "model-driven" method, as such terms are discussed elsewhere herein. While 3D data in the form of point clouds is used along with "geometric primitives" to generate the 3D information of the structure of interest, the inventive methodology is not a "hybrid method" as such term in known in the art. In this regard, hybrid approaches use information derived from the 3D data via segmentation algorithms etc. to identify features such as boundaries (e.g., ridges and edges), for example, and then apply "geometric primitives" in the form of expected building elements from a pre-defined library of such expected building elements. Notably, the "geometric primitives" as meant in the prior art are defined by way of being actual components in building structures or parts of building structures, much like "puzzle pieces" that are selected to best fit into the "puzzle outlines" presented in a generated point cloud incorporating a structure of interest therein.

In contrast, the inventive method extracts (or isolates or resolves or segments) one or more of a finite list of mathematically generatable geometric primitives directly from processed 3D data, where such processed 3D data is generated from the methodologies herein. The present method does not find a geometric primitive that fits the point cloud best; rather, the present method extracts (or isolates or resolves or segments) a geometric primitive that possesses the same shape of that set out by the boundary information present in the processed 3D data, which is, by definition, the not the "best fit" but, in fact, the actual fit.

The inventive methodology lends itself to improvements in automatic generation of wireframe renderings from the processed 3D data having boundary data. For example, in some aspects, the present invention allows accurate wireframe renderings of one or more structures of interest in a scene to be automatically generated substantially without the need to first reference a separate library of shape primitives, solid building primitives, pre-defined object shapes, or description of a structure using a formal grammar against point clouds and/or the images including the structure of interest. The ability to directly identify or isolate or resolve or segment geometric primitives from the 3D data having boundary information therein, that is, 3D and/or 2D data processed according to the methodology herein, to generate wireframe renderings enables structures that have not previously been incorporated into building models or object libraries to be processed into wireframe that are true to the original form of the structure of interest. Such generated wireframes can be one or more of substantially accurate representations of the surfaces and surface boundaries of the structure of interest, and numerically accurate, topologically accurate, and semantically accurate. In other words, the present invention enables accurate wireframe renderings of *sui* generis or "arbitrary" structures of interest to be generated, whether automatically or otherwise.

In prior art methods in which geometric primitives are utilized to derive building models from structures, confirmation that the derived wireframe renderings, such as various features or shapes present on a roof, for example, is conducted using look ups in a shape library that is accessed during processing into a wireframe. This necessarily requires the structure of interest or elements comprising that structure of interest to be present in the library for the resulting information to be accurate. Notably, the present invention provides significant improvements in the ability to generate accurate wireframe renderings from structures that may be substantially non-symmetrical and/or comprised of unique or non-conforming shapes. Using prior art methods, such shapes can present challenges because it is unlikely that a library of shapes used to generate the wireframes will include the subject shape. The present invention allows such asymmetrical/unique/non-conforming shapes to be successfully generated into wireframe renderings. The present invention therefore allows structures of interest to be accurately processed into wireframe renderings even when a corresponding confirming shape is not present in a look up library. This aspect enhances the ability to obtain structure information substantially automatically because a reference shape is not necessary to ensure that the resulting wireframe is correct. For at least this reason, the present invention represents substantial improvement over prior art methodologies.

Moreover, the present invention allows structures that include custom or unexpected features to be accurately represented as wireframe renderings. For example, a structure of interest may incorporate a combination of atypical features, where it is unlikely that a pre-defined library of objects may include these features in combination. Any attempt to generate an accurate wireframe rendering of this unique combination of features using prior methodology will require at least some human supervision. This can be contrasted with the inventive methodology wherein such atypical features can, in some aspects, be resolved substantially without human supervision to generate an accurate wireframe rendering of the structure of interest.

Moreover, prior art methods often ignore the recognition and modeling of structures such as dormers, chimneys, doors, windows, and other building parts like balconies, oriels, and stairs due to the inherent complexity that these structures impose to the problem. The complexity of these structures arises from the fact that they are typically enclosed by a larger structure or element of interest. The present invention accounts for hierarchical relationships that might exist between individual surfaces. Accordingly, in some aspects, at least two geometric primitives will be extractable (or isolatable or resolvable or segmentable) from the processed 3D data, where at least part of the boundaries of one of the geometric primitives is incorporated within the boundaries of the second geometric primitive.

Another shortcoming of the prior art methodologies is the assumption that point cloud data having a minimum noise level is provided as the input data. Additionally, it is often assumed that the structure of interest is already segmented and isolated from the rest of the scene in the point cloud data. Since point cloud data generated from real-life environments often contains extra structures and artifacts due to tree clutter, reflection from windows, water features, transparent surfaces, feature-less or poorly-textured surfaces, etc. these assumptions prove to be unrealistic in practical settings. Errors underlying the assumptions inherent in prior art methodologies will often result in an incorrect geometric primitive being selected for fitting to the point cloud data from the pre-defined library of shapes, thus leading to errors being propagated in the resulting wireframe renderings. Accordingly, the wireframe renderings generated from prior art methodologies that incorporate such assumptions will require correction by manual interventions.

In some cases, a structure of interest can be represented as a collection of geometric primitives from the list of Table 1, wherein each of the geometric primitives is, independently, identifiable, isolatable, resolvable, or segmentable from the processed 3D data. In this regard, the geometric primitives together can be represented as a single geometric primitive having all or part thereof within the surface boundaries of another geometric primitive. Still further, a structure of interest can be characterized as a wireframe rendering generated from at least two geometric primitives from Table 1 wherein at least part of a first geometric primitive is within at least some of the surface boundaries of a second geometric primitive. The geometric primitives can be the same or different. An example of different geometric primitives can comprise a first plane within a second plane is the case of a skylight present on a roof. In this case, there will be two planes with outer sections, and additional or iterative processing of the processed 3D data could be needed to generate the wireframe rendering and/or resolve the measurements of each of these planar sections. An ellipsoid or other type of rounded geometric primitive could be fully or partially included in the surface boundaries of a plane. An "eye-browed" roof design, for example, is an example of a situation where a rounded geometric primitive can be incorporated in a geometric primitive that is a planar. The inventive methodology can allow accurate wireframes for each of the structures of interest to be generated therefrom.

FIG. 1 illustrates an implementation of the inventive methodology to generate wireframe renderings of a structure of interest in a scene. In an exemplary wireframe generation process 100, in 105 the present methodology receives 2D data and 3D point cloud data as input for the wireframe generation process, where such data is referred to as "processed 3D data having boundary information" elsewhere herein. As discussed previously, such processed 3D data can be generated from 3D point clouds and 2D image data associated with such point clouds. The processed 3D data can also comprise 3D point clouds without associated image data, where the 2D data incorporated therein is generated from the virtual/synthetic view process to provide the processed 3D data having boundary information therein.

As an overview, in 110 an optimum resolution is calculated, in 115 that result is transferred to a hyperspace, in 120 a surface continuity image is generated, followed by the finding of connected regions in 125, whereby the structure of interest is isolated in 130. Once the structure of interest is isolated from the processed 3D data, 3D data associated with 2D is processed in 200-235, specifically in the steps of: calculating optimum resolution in 205; transferring the data from 205 to a hyperspace; generating a surface continuity image in 215; finding all geometric surface patches in 220; merging geometric surface patches to generate geometric surfaces in 225; finding and optimizing concave hulls for each geometric surface in 230; and combining and optimizing the collection of concave hulls (i.e., surface boundaries). A wireframe rendering of the structure of interest is generated in 300.

Certain segmentation and related steps are conducted in both 105 (which operates to isolate the structure of interest from the processed 3D data) and 200 (which operates on the isolated structure of interest) in order to reduce noise and increase accuracy. A prerequisite for such segmentation is to generate a surface continuity image in which can then be segmented into regions of interest according to elevation, surface continuity, overlap and occlusion, surface area, enclosing concave hull shape, geo-location data, and/or the like. These regions can then be transferred into the coordinate system of the given 3D data and the data could be segmented accordingly.

Since the 3D data can be provided in absolute scale or it can be provided in an unknown scale (as can be the case in point clouds generated using image-based solutions without utilizing geo-location data or ground control points), a scale-invariant process can be applied. For example, a wireframe generation process applied to a point cloud having in an arbitrary scale can be as successful as the wireframe generation process for the 3D data provided in the absolute scale. For this purpose, an optimum resolution can be calculated for the entire 3D dataset and then the 3D data is transferred to a hyperspace that is insensitive to the scale of the 3D data.

Once the 3D data is transferred into the hyperspace at 115, a surface continuity image can be generated at 120 that highlights any discontinuity in surface coordinates or parameters, normal vectors, overlapping surfaces, occlusion, and density of the data in the given resolution. A local maxima in the surface continuity image can be a seed point to isolate an structure of interest at 130. Having a seed point, seed-based segmentation algorithms could be used to find a connected region in 125 in the surface continuity image and then transfer that to an enclosed volume in the 3D data. In this regard, let I define the surface continuity image and $p(u,v)$ with $(u,v) \in \Re^2$ be a scaler function that defines the image. The morphological gradient of I is $\delta_{D^p}$, =(p•D)−(p∘D) where (p•D) and (p∘D) are the elementary dilation and erosion of p by the structuring element D. The Laplacian in this case is given by $\Delta_{D^p}$=(p•D)−2p+(p∘D). Each connected region is a structure of interest and is processed separately in the following steps in order to extract the wireframe.

For each segmented structure of interest in the 3D data (where segmentation thereof occurs in steps 205-215), local geometric surface patches can be extracted in 220 according to canonical expressions that were presented for twelve scenarios in Table 1. This exploits the local geometric relationships among points on the same quadric surface. This segmentation clusters the 3D data using lossy-compression. Assuming $\hat{p}$ is from a mixture of Gaussians and putting a segmentation into K clusters as $\hat{p} = \{\hat{w}_1 \cup \hat{w}_2 \cup \ldots \cup \hat{w}_K\}$, then the total number of bits to encode $\hat{p}$ up to distortion $\lambda$ is $$L^s = \{\hat{w}_1, \hat{w}_2, \ldots, \hat{w}_K\} = \sum_{i=1}^{K} \left[ L(\hat{w}_i) - |\hat{w}_i| \log_2 \left( \frac{|\hat{w}_i|}{N} \right) \right]$$

The 3D data in each segmented group should be then transformed to a canonical pose to improve the conditioning of the quadric model parameter estimation. For this purpose, the 3D data is first translated by subtracting the centroid, followed by a Singular Value Decomposition (SVD). The rigid transformation is then calculated from the centroid and a unitary matrix from the SVD which can be viewed as a matrix in SO(3). Afterwards, a fully quadric model is fit using a least-square formulation. This model is $\tilde{\mathcal{P}}^T \ominus \tilde{\mathcal{P}} = 0$; $\ominus \in \mathbb{R}^{10 \times 10}$, which can be expanded as $$ax^2+by^2+cz^2+fyz+gzx+hxy+px+qy+rz+d=0.$$

The least-square optimization of this model can be performed using MLESAC, which is an accurate and robust method in the presence of measurement uncertainty and noise.

The local geometric surface patches are then merged in 225 and expanded based on a model merging process to create 3D surfaces. This is an iterative process and merges the points from the same surface primitives followed by re-estimating the quadric model. Concurrently, the decision-making process can be cross-referenced with the surface continuity image so that the overall integrity of the data is preserved. Noise level in the 3D data can comprise a significant factor in identifying the appropriate primitive geometry parameters to a local surface patch. As can be seen in practice, the noise level in 3D data from expensive equipment like laser scanners is negligible compared to the noise level from inexpensive capture methods such as photogrammetry and image-based 3D reconstruction. This is ignored in the prior art methods as they assume 3D input data with a certain noise level, thus reducing the quality of wireframe generation from photogrammetry and image-based 3D reconstruction. The present invention substantially eliminates this concern by proposing an adaptive threshold approach for defining the acceptable lower and upper threshold levels in fitting model parameters to the set of observed data. Each geometric surface patch therefore has its own threshold values and the conflicts among intersecting surface patches are resolved through maximizing a likelihood function. This makes the entire wireframe generation process resilient and robust notwithstanding the noise level in the input 3D data. Accordingly, the present invention can allow accurate 3D wireframe renderings to be generated from 3D data generated from devices other than laser scanners, such as passive image capture devices.

Surface continuity images can help to eliminate noise present in the 3D data that, if present, could reduce the accuracy of the resulting wireframe. A surface continuity image can be generated to allow filtering of the primitive geometric surfaces such that the noise in boundaries can be minimized and to ensure that there is substantially no redundant/wrong segments attached to the primitive geometric surface(s) from which the wireframes are rendered.

A concave hull or alpha shape can be assigned to each extracted 3D surface in 230. The concave hull defines the 3D surface boundary and is the primary component for generating a wireframe rendering for a structure of interest. Rule-based reasoning appropriate for a specific application can also be used to assign a polygon to each boundary followed by simplifying the resulted polygon, where the applied rules are derived from specific conventions that are relevant. For example, when the structure of interest is a building, the applied rules can primarily be adapted from standard construction practices and conventions. In this regard, specific application in which the invention herein will be used, will have normal or typical characteristics, such as roof angle, length, pitch, and shape conventions or the like. A series of shape optimization or shape inference rules could further be applied to minimize noise, enhance consistency of polygons, and enforce similarity/parallelism/symmetry. As an exemplary process, this could include projecting the concave hull into 2D images and then evaluating the validity of the concave hull shape based on pixel region properties such as intensity change, spatial derivative, texture, and the like. The same properties could be further used to fine-tune the projected 2D concave hull and then transfer the optimum shape from 2D to the 3D space.

If appropriate, a hierarchical relationship can be established among the detected surfaces to ensure the correct representation of superstructures and parent-child features such as roof dormers, chimneys, windows and doors, stairs, and the like. As an exemplary process, detected surfaces can be projected into a base surface. If the base surface wholly or partially encloses a projected surface and the projected surface satisfies some predefined geometrical constraints (e.g., shared vertices, shared edges, small distance to the base surface, parallelity of the surfaces, perpendicularity of the surfaces, etc.), a parent-child relationship is established. These relationships could have multiple depths among different surfaces and hence create a hierarchical relationship.

In 235 individual surface boundaries (i.e., polygons) are then combined to create the wireframe of the structure of interest in 300. In this step, shared polygon vertices, intersecting edges, overlapping edges, intersecting planes, overlapping planes, intersecting surfaces, overlapping surfaces, etc. are detected. Several other criteria can be used in merging the adjacent edges on different polygons such as spatial proximity, direction of the edges, length of the edges, geometry of the connected polygons, symmetry of the structure, etc. A 2D and/or 3D global optimization (e.g., multi objective linear optimization) can be defined accordingly by combining all the previously mentioned rules that were used to optimize individual surfaces/polygons. This global optimization can ensure the integrity of the wireframe for the whole structure of interest. The outcome is a wireframe that presents an information-rich abstraction of a structure of interest.

Although not shown on FIG. 1, once generated, individually optimized concave hulls or polygons generated may optionally be further be sent into a machine learning pipeline that is trained over fine-tuning the 3D coordinates of polygon vertices and/or their appearance in 2D images. One exemplary process can be projecting each 3D vertex onto images or virtual views that include the given vertex. The projected coordinates can then be fine-tuned such that the cornerness probability is maximized. The fine-tuned 2D coordinates are converted into 3D coordinates by applying the visual triangulation technique discussed herein above in relation to generation of "virtual/synthetic views." Such information generated from machine learning processes can be used in training sets etc., as discuss hereinafter.

In a separate inventive aspect, the processes herein allow accurate wireframe renderings of one or more structures of interest in a scene to be generated directly from a plurality of 2D images without the generation of point clouds as an interim step. In other words, a wireframe rendering is derivable directly from 2D image data including the structure of interest. Such methodologies can be useful to, for example, generate wireframe renderings that require less computation resources than are required for wireframe generation via point clouds.

In this aspect, machine learning models and computer vision techniques are utilized to generate 3D data from which wireframe renderings can be generated using substantially only images and/or camera parameters derived from the 2D images. In this regard, machine learning models and computer vision techniques used can include, but is not limited to, validation of the information present in a scene, accuracy of information about a scene, presence of objects of interest in scene, location of objects of interest in a scene in relation to each other, location of objects in a scene in 3D space, labels of objects of interest, counts of objects of interest, and/or grouping of objects of interest. These techniques can include as non-limiting examples: neural networks, regression models, and/or binary classification models.

This aspect of present invention further includes the continuous or periodic training of machine learning models based on information automatically generated by operation of the present invention or additional information that may be, but does not need to be provided by users, outside data sources, or already trained machine learning models.

Figure 2:
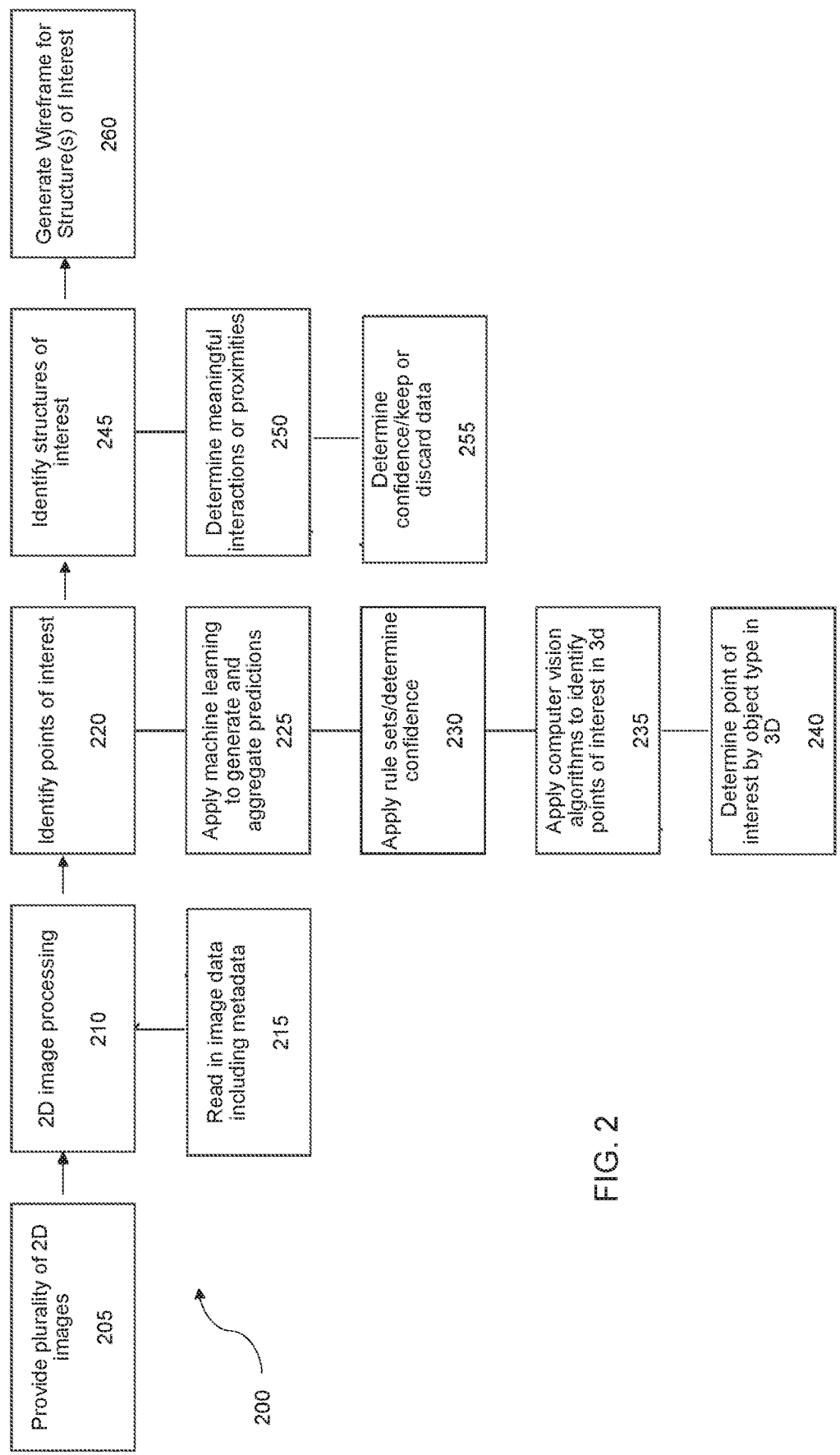
FIG. 2 illustrates an exemplary process for generating wireframe renderings directly from 2D data.

FIG. 2 illustrates an implementation of the inventive methodology. In an exemplary process herein using a combination of machine learning and computer vision techniques combined with use of camera parameters, and images or videos incorporating the structure or object of interest, the present methodology can allow the generation of wireframe rendering for each structure of interest, counts of objects, locations of objects in relation to one another or in the real world when GPS data is available with no need for pre-processing of the 2D image data to generate point cloud data as an interim step. The process is separated into logical steps of 2D information processing, extraction of points of interest, determination of relation of points of interest to create structures of interest, and turning structures of interest into wireframe renderings.

As illustrated in FIG. 2, the process 200 is as follows. 2D images are provided in 205 for image processing in 210. An implementation of such image processing 210 is reading, by the computer, image data including metadata in 215. Such metadata can include, for example, GPS data, intrinsic and/or extrinsic camera parameters, image height, and/or image width.

From image processing step 210, points of interest derivable from the images are identified in 220. In this regard, in 225 a plurality of predictions is generated and aggregated via one or more machine learning models comprising one or more training sets pertinent for making aspects of the 2D images that might comprise potential structures of in the scene. For example, machine learning algorithms having training sets relevant for the identification of building elements (e.g., roofs, roof parts, doors, windows, etc.) or building interior elements (e.g., doors, windows, floors, walls, mechanical systems, furniture etc.) can be used to generate predictions in 225, which are then, optionally, analyzed against rule sets and determining confidence levels in 230. The parameters of 230 can be a function of how many false positives, false negatives, or how far off by some measure of accuracy a prediction can be while being considered acceptable by later steps or users of the process. Specifically, a rule set may or may not be applied in 230 depending on the baseline parameters ascribed to determine the accuracy of the prediction. The outputs of the machine learning models will then be aggregated across all objects and all images to be fed into one or more computer vision algorithms to identify points of interest in 235, whereinafter the point of interest is determined by object type in the 3D context in 240. A variety of algorithms can be applied in 235 to provide additional information such as the triangulation of objects in 3D based on their predicted position is 2D space from multiple viewpoints in a scene. The point of interest by object type is the output of 240.

It should be noted that the output of one aspect or all of step 220 can be useful on its own and may be provided as output in the case of interest in strictly 2D information, where such generated predictions can be used in machine learning methods, such as the determination of 3D location of objects amongst one or more other objects. Such generated information may then be fed into additional computer vision algorithms, machine learning algorithms, or rule sets in order to combine the information into a new set of information which provides context to how the detected objects interact with one another to thereby generate one or more meaningful, higher-level structures. From these generated structures, the information can be turned into wireframes or any other type of meaningful information based on 3D positioning, labels, or context of the structure. Furthermore, in some aspects, the present methodology is scale invariant. This means that the surface boundary or wireframe generation process for 3D data having an arbitrary scale can be as successful as the process on 3D data with absolute scale.

In 245, the structures of interest are identified by determining meaningful interactions or proximities of the data in 250, followed by processing in 255 to determine confidence levels whereby data is kept or discarded. Wireframe renderings for the structure(s) of interest are the output 260 of process 200.

Similar machine learning workflow or logic could be used to auto-draft a structural sketch from one or a plurality of 2D images. As a non-limiting exemplary process, a single aerial orthographic image from a roof structure could be fed into the system. The output could be a 2D orthographic wireframe that includes 2D coordinates of corner points, edges, connected surfaces, edge dimensions, measurements, edge types, and the like. Measurement information in this orthographic wireframe is accurate for edges that are perpendicular to the orthographic projection vector. Other measurement information will have varying levels of error depending on the angle of the edge with the orthographic projection vector which is an unknown value; higher angle difference would lead to higher errors. One exemplary method to completely eliminate such an angle-dependent error is to manually provide the algorithm with the angle value for each edge allowing the algorithm to calculate the offset and accordingly precise measurements.

Regardless of how the wireframe renderings are generated (e.g., via 2D and/or 3D data), the generated wireframe renderings and any data associated therewith can also optionally be sent into a machine learning pipeline that has been trained on fine-tuning the 2D and/or 3D geometry of a wireframe and its appearance in 2D images. As would be recognized, such machine learning pipelines will be conducted fully automatically by the computer. Such relevant geometry could include vertices, edges, global or local 3D coordinates, length, direction, angle, surface area, enclosed volume, geo-coordinates, connectivity of different surfaces of one or more structures, occlusion and overlap between surfaces, and the like. The machine learning pipeline can be configured to be able to identify inconsistencies in the overall geometry of the wireframe and to further fine-tune the geometry to ensure the wireframe is geometrically and dimensionally accurate prior to use thereof in engineering-related applications where accuracy is an important aspect. In this regard, when the information derived from the wireframe renderings, is placed into a machine learning process incorporating relevant training sets, improvements can be generated in the algorithms used to process the 3D data which will, in turn, result in improvements to the subsequent generation of wireframe renderings.

In further aspects, the methods can incorporate the step of checking the characteristics of the resulting polygon(s), or portion thereof, obtained for each extracted (or isolated or resolved or segmented) primitive geometric surface against a library of existing shapes while or after the wireframe is generated. Such confirmation can be incorporated into stored information associated for use. Note that such a library of existing shapes is referenced after one or more geometric primitives are first isolated or resolved from the 3D data. Such library of existing shapes can be provided as a result of information generated from machine learning processes, as discussed elsewhere herein.

Furthermore, the geometry of identified surfaces in wireframe renderings may be embedded in an object-based representation format. In this format, each surface can be represented with an object that encompasses the geometrical properties of the surface using several features or variables. Topological relationships among the identified surfaces could be further added to the object-based representation. This could include connectivity, occlusion, overlap, logical and/or binary relationships (e.g., a skylight is on top of a roof plane or cutout relationship between a window and a wall), constraints in a practical setting (e.g., a wall is perpendicular to a ceiling), and the like. This can be further expanded to include the semantic information for each surface including but not limited to object label, edge type, material type, material layers constructing the surface, unit cost of material or labor, maker, model, date, heat transfer coefficient, strength of the material, field notes, maintenance data, maintenance history, etc. Such a comprehensive representation can transform a CAD model into the more detailed BIM model. The present invention therefore comprises generating a BIM model from a CAD model using the methodology herein. Once again, machine learning models can optionally be used to better ensure the consistency and validity of the resulting wireframe renderings for use in BIM models, as well as fine-tuning of examples that deviate from their optimum state.

When more than one structure of interest is present in a scene, the inventive processes can be repeated for each structure of interest so that a wireframe rendering can be generated for each of the separate structures of interest. Such individual wireframe renderings can then be merged/combined to create an overall wireframe which is a representation as a collection of all structures of interest in the scene. A global optimization problem can then be formulated to optimize the entire scene, and the structures of interest incorporated therein based on one or more of a spatial proximity, direction of the edges, length of the edges, geometry of the connected polygons, symmetry of the structure, etc.

By way of example, given a number of 2D images and/or 3D point clouds generated from a scene that can be processed according to the methodology herein, the appearance of the scene from a new viewpoint that did not exist before can be predicted. These transformations can be configured to directly operate on images and recover scene information that is appropriate to accomplish the desired effect. Information generated therefrom can be incorporated into computer vision algorithms, such as those used in the process described in FIG. 2 herein, as well as in other implementations.

Still further, such generated transformations could also be used directly to process 3D points derived from a point cloud to thereby generate 2D representations through perspective geometry methods, such as by generating virtual/synthetic views from point clouds where no 2D images are associated with such point clouds. Such generated 2D can then be used with the parent point clouds to provide 3D data having boundary information therein. Such would be the case from a point cloud generated from LiDAR where no images are associatable therewith. The number of virtual/synthetic views that could be generated is virtually limitless as there is no restriction on intrinsic and extrinsic parameters of these views.

In the case of creating virtual/synthetic views from a 3D point cloud, a set of intrinsic and extrinsic parameters can be selected for a desired virtual/synthetic view with respect to the coordinate system of the given point cloud. Once these parameters are fixed, a 3D transformation could be calculated that converts 3D coordinates of each point in the point cloud into 2D coordinates in the image plane. The color information of the point from the 3D point cloud can then be assigned to the projected 2D point. A z-buffer approach can also be utilized to account for visibility, occlusion, and different depth values for points that fall into the same pixel coordinates. This allows assigning a depth value to each pixel in the virtual/synthetic view. Depending on the existence of color or gray-scale point clouds and utilization of the depth value for each pixel, the generated virtual/synthetic view/image could be one or a plurality of the following types: gray-scale depth image, gray-scale image, color depth image, color image, multi-layer gray-scale depth image, multi-layer gray-scale image, multi-layer color depth image, multi-layer color image, etc. In the case of unavailable data for certain pixels in the virtual/synthetic view/image, the empty pixels might be filled using an inpainting image repair approach. The notable advantage of such complete virtual/synthetic view/image is that they can be directly used in any algorithm that consumes different image types as input data (such as feature detection, object identification and labeling, object segmentation, region growing, etc.) as if there was a real camera capturing the scene from that viewpoint.

Illustration of the methods in practice can provide context for the invention. In relation to roofing applications, which is presented as a non-limiting example, wireframe renderings derived from 3D data having 2D information associated therewith, such as a point cloud and a plurality of 2D images of including a roof of interest, can be generated. In this regard, a 3D point cloud having boundary information therein that is derived from processing images and scans of an actual roof will comprise information therein related to each of the measurements or dimensions of the roof (e.g., lengths on the back, front and sides of the structure, any features such as gables or hips or eaves or ridges, bounding relationships between roof parts, and the pitches/angles or azimuth thereof etc.). Individual structures or collection of structural components present in the processed 3D data can be extracted (isolated, resolved, or segmented) as geometric primitives as discussed previously, where such geometric primitives are selected from the group consisting of those in Table 1. Such geometric primitive information can be used to define surface boundaries, so as to allow one or a plurality of areas on the roof to be generated as one or more wireframe renderings using the hereinabove described processing steps. Such wireframe renderings, which can be accurate as to measurements, dimensions, geometry etc., can be generated directly from 3D data generated substantially without manual intervention by a user.

In roofing applications, for example, the methodology herein could be augmented by incorporating methods for matching roof dimensions as measured during different times of roofing construction process or by different sources of measurements. For example, prior to ridgecap placement, the dimensions of relevance are evaluated in relation to the roof plane, but once the ridgecap is in place, roof dimensions are taken from top of ridgecap to corner. Yet further, accurate information about planar components in at least one structure of interest can be derived from scanning or imaging substantially without attendant knowledge of the pitch, angle, etc. associated with the planar aspects present in the structure(s). In other words, the pitch of a plane as present in the original structure of interest can be obtained directly from the methodology herein. Moreover, accurate information about a collection of planar structures and their relationships with and between each other to make up the total roof structure can be generated directly from a point cloud generated from scanning or imaging of the roof. Each of these planar structures can be processed as set out further herein to render the accurate wireframe comprising the collection of planes. More complex structures, such as a roof having multiple pitches, gables, hips, non-planar features, and the like can also be generated into an accurate wireframe directly from data derived from scanning or imaging that roof.

In relation to generating wireframe renderings of all or part of a building façade, wireframe renderings derived from imaging or scanning of the façade, will comprise each of the measurements or dimensions the façade and any sub-structures therefrom (lengths on the back, front and sides of the structure, any features such as windows, doors etc.). Individual structures or collections of structures associated with the façade can be represented as extracted (or isolated or resolved or segmented) geometric primitives selected from the list in Table 1, as discussed previously. Wireframe renderings, which are accurate, can be generated directly from therefrom substantially without manual intervention by a user.

In relation to generating wireframe renderings of structures in an interior setting, such as a lobby, wireframe renderings that are derived from 3D data are derived from imaging or scanning of the lobby will comprise each of the measurements or dimensions the lobby and any sub-structures therefrom (e.g., lengths or heights of walls, floors etc., any features such as windows, doors etc.). Individual structures or collections of structures can be represented as isolated or resolved geometric primitives as discussed previously. Wireframe renderings, which can be accurate, can be generated directly from the geometric primitives substantially without manual intervention by a user.

In relation to generating information about structures in an interior setting, such as a floor plan, wireframe renderings generated from 3D data that are derived from imaging or scanning of the floor plan will comprise each of the measurements or dimensions the floor plan and any sub-structures therefrom (e.g., lengths or heights of walls, floors etc., any features such as windows, doors etc.). Individual structures or collections of structures can be represented as isolated or resolved geometric primitives as discussed previously. Wireframes, which can be accurate, can be generated directly from point clouds etc. substantially without manual intervention by a user.

While specific examples of roofs, building facades, lobbies, and floor plans have been provided, it should be understood that the type of structures, and parts of structures for which wireframe renderings can be provided using the methodology herein is expansive. As long as one or more of the specified geometric primitives listed in Table 1 can be identified, isolated, resolved, or segmented from the processed 3D data having boundary information therein, wireframes can be rendered. Moreover, in significant aspects, such wireframe generation is substantially or totally automatic, and such wireframes are accurate, as such term is defined elsewhere herein.

As mentioned previously, 3D data from which the wireframes can be derived can comprise point clouds, polygon meshes, or vector models. The following section provides additional description regarding the sources of 3D data prior to incorporation of the 2D data therein to provide processable 3D data.

As used herein, a "point cloud" is a set of data points in the same coordinate system. In a three-dimensional coordinate system, these points are usually defined by X, Y, and Z coordinates. In some aspects, a point cloud will be generated to provide information about the boundaries of the object(s) for which information is incorporated. 3D data for use herein can be generated from point clouds incorporating the structure of interest. Point clouds suitable for use in the present invention can be generated by one or more methods known to those of ordinary skill in the art. Additional information about point cloud generation is provided hereinafter.

Suitable point clouds can be generated from a plurality of 2D images of the scene having at least one structure of interest incorporated therein, wherein the plurality of 2D images are generated from a single passive image capture device. In this regard, point clouds suitable for processing according to the methods of the present invention can be generated according to the methods disclosed in the '517 patent, previously incorporated by reference. In particular, the '517 patent describes point cloud generation from, in some aspects, a single passive video camera where the camera is moving through the scene, and the processing thereof to generate point clouds having the features described therein.

When the 3D data are derived from a plurality of 2D images taken from a scene comprising the one or more structures of interest, a variety of image capture device configurations can be used to generate a plurality of 2D images suitable for use herein, including image capture devices integrated into a device such as a smartphone (e.g., iPhone® or Galaxy®), tablet (e.g., iPad® or Amazon Fire®), autonomous capture device (e.g., drone or robot), or a wearable device or the image capture devices can be as stand-alone camera device (e.g., a GoPro®). The at least one, or one or more, image capture devices can also be incorporated in a specialized measurement device.

Point clouds derived from stereographic image capture methodologies can also suitably be used. Yet further, other forms of stereographic imaging can be utilized to generate suitable point clouds for use herein, such as that disclosed in U.S. Pat. No. 8,897,539, the disclosure of which is incorporated by reference herein in its entirety.

Point clouds derived from structured light imaging devices e.g., the first version of Microsoft Kinect®, Matterport®, Tango®, etc. can also be used. As would be understood, such devices combine RGB imaging with depth detection otherwise known as RGBD images. Such images can be processed to generate point clouds using known methods, such as utilizing MATLAB, or open source software libraries, such as the "Point Cloud Library." Yet further, Tango-derived images incorporate information derived from motion tracking images with integration of accelerometer and gyroscope data to generate detailed data about the movement of the image capture device in space, as well as depth information about one or more structures of interest in a scene. Software configured for use with Tango-derived images can be used to generate point clouds therefrom. Other forms of structured light instruments and methods can be used to suitably generate point clouds for use herein.

Point clouds generated from time of flight imaging devices are also suitable for use herein. As would be recognized, a time of flight imaging device computes the distance or depth value based on the known speed of light and based on measuring the time of flight of a light signal between the camera and the reflecting object, for each point of the resulting image. In a time of flight imaging device, the entire scene is captured with each laser or light pulse. The current version of Microsoft Kinect® is a time of flight imaging device.

Yet further, point clouds generated from ground-based or handheld or airborne LiDAR can be used herein. One suitable method for generating point clouds from LI DAR is disclosed in US Patent Publication No. US20090232388, the disclosure of which is incorporated herein in its entirety.

Point clouds suitable for use herein can also be generated from GPS data coupled with provided 2D images. For example, when a number of aerial images having suitable overlap are taken from multiple view angles generated in conjunction with GPS data, a dense point cloud of one or more objects present in a scene wherein the object(s) are geo-referenced can be generated.

In some aspects, point clouds from which the wireframe renderings are derived herein are generated from a plurality of 2D images of a scene, where the scene includes all or part of one or more structures of interest. At least one passive image capture device can be used to generate the plurality of 2D images. Yet further, one or more image capture devices can be used to generate the plurality of 2D images, where such plurality can include, but is not limited to, multiple separate capturing devices or camera arrays.

The plurality of 2D images used herein can be obtained from a moving camera device. Still further, the plurality of 2D images used herein can be obtained from a video camera. The 2D digital images can be generated by an image capture device that comprises a passive sensing technique. The image capture devices used to generate the plurality of 2D images can be "calibrated" or "uncalibrated," as such term is defined in the '517 patent, previously incorporated by reference.

As used herein, "video" means generally that the images are taken, for example, as single frames in quick succession for playback to provide the illusion of motion to a viewer. In some aspects, video suitable for use in the present invention comprises at least about 24 frames per second ("fps"), or at least about 28 fps or at least about 30 fps or any suitable fps as appropriate in a specific context.

In accordance with some aspects of the invention herein, use of a plurality of 2D images derived from video can improve the ease and quality of user capture of the plurality of 2D images for use herein, so as to allow higher quality point clouds to be generated for use herein. As one example of this improvement, the sequential nature of video has been found by the inventors herein to improve the quality of wireframe renderings. Still further, the inventors herein have found that use of video as the source of the plurality of 2D images can allow tracking of points that are inside (i.e., tracking points within the boundaries of the images) or outside of the images of the object of interest (i.e., continuing to track points that are first "followed" when in the image frame, and then tracking estimated positions of those points no longer in the images intermediate in time (the points have moved outside the boundaries of the images). When those points are in the field of view of later image frames, the later-followed points can be substantially correlated to those same features in the earlier image frames), where such point tracking provides improvements in the 2D image information used for processing herein, such as by creating multiple vantage points of full or partial views of the given object. Each vantage point can provide more information which, in turn, can improve the quality of measurement and prediction. Still further, the inventors herein have found that use of video as the source of the plurality of 2D images can allow tracking of structures in sequential frames. Tracking of structures in sequential frames can provide a basis for prediction from one frame to the next.

While the present invention is suitable for use with image capture devices that generate a video from which 2D images can be provided, the present invention is not limited to the use of video. That is, the plurality of 2D images can suitably be provided by an image capture device that provides 2D still images, such as a "point and shoot" digital camera. These images require the minimum amount of overlap necessary in order to recreate the scene they comprise. The plurality of 2D images herein are suitably overlapping. As used herein, "overlapping" in relation to 2D images means individual images that each, independently, include at least one object of interest, where at least some of the images overlap each other as to one or more dimensions of each of the one or more structures of interest are concerned. As would be recognized, 2D images derived from video will be overlapping. To provide suitably overlapping 2D images incorporating the at least one object of interest from sources other than video, the individual images can be overlapped, where such overlap is, in reference to the at least one object of interest, at least about 50% or at least about 60% or at least about 70% or at least about 80% or at least about 90%. In some embodiments, the amount of overlap in the individual images in the plurality of overlapping 2D images, as well as the total number of images, will also depend, in part, on the relevant features of the object(s). In some aspects, such relevant features include, for example, the amount of randomness in the object shape, the texture of and size of the at least one object of interest relative to the image capture device, as well as the complexity and other features of the overall scene.

As would be recognized, a plurality of still 2D images taken in sequence can also be defined as "video" if played back at a speed that allows the perception of motion. Therefore, in some aspects, the plurality of overlapping 2D images can be derived from a plurality of digital still images and/or from video without affecting the substance of the present invention, as long as the plurality of 2D images of the scene including the one or more structures of interest can be suitably processed to generate detailed scene and object information from which the measurements etc. and predictions can be generated.

In some aspects, the plurality of 2D images includes at least two 2D images of the scene, wherein each of the plurality of 2D images incorporate at least some of the one or more structures of interest. In other aspects, the plurality of 2D images includes at least 5, at least 10, or at least 15 or at least 20 2D images of the scene, wherein a plurality of the 2D images of the scene incorporate at least some of the one or more structures of interest. As would be recognized, the 2D images appropriate for recognizing the one or more structures, or generating one or more of counts or predicted labels or generating 3D information which can then provide some, all, or none of geometric, topological, semantic, and/or any 3D information for the one or more object of interest in a scene will depend, in part, on factors such as the size, texture, illumination, degree of randomness in the object shape, as well as the complexity and other features of the overall scene and potential occlusions of the object of interest, as well as the distance of each of the one or more structures of interest from the image capture device.

As noted, the plurality of 2D images generated for use in the present invention can be generated from at least one, or one or more, image capture devices comprising passive sensing techniques. Yet further, the 2D images can be generated by at least one, or one or more, image capture devices that consist essentially of a passive sensing technique. As would be understood by one of ordinary skill in the art, "passive-image capture devices" means that substantially no active signal source such as a laser or structured light (as opposed to camera flash or general-illumination devices) or sound or other reflective or responsive signal is utilized to measure or otherwise sense either or both of the scene and any of the one or more structures of interest. Additional information may be generated from one or more active devices used in conjunction with the previously aforementioned passive device or devices. As would be understood by one of ordinary skill in the art, "active-image capture" devices means that active signal source such as a laser or structured light (as opposed to camera flash or general-illumination devices) or sound or other reflective or responsive signal is utilized to measure or otherwise sense either or both of the scene and any of the one or more structures of interest.

Yet further, the plurality of 2D images are derived from at least one, or one or more, passive image capture devices, wherein the image capture device is moving relative to the scene where the structures in the scene are moving in a rigid body motion. In other aspects, the 2D images are derived from at least one, or one or more, passive image capture devices, wherein one of the devices is not stationary relative to the scene or the structures. Yet further, the scene and any included one or more structures of interest can be moving relative to the at least one, or one or more, passive image capture devices in a rigid body motion. Additional images or other data may be derived from one or more active image capturing devices which may be stationary or moving as it may be helpful to the process of object identification and detection, as may be included as additional aspects of the process.

The image capture devices can be configured to generate the plurality of 2D images of the scene and one or more structures of interest from ground, underwater, underground, cosmic or aerial locations, where aerial imaging can be conducted by, for example, drones, satellites, balloons, helicopters, unmanned aerial vehicles, manned airplanes or the like. Ground captures can include any capture taken from an autonomous vehicle, planar or legged robot, or any device with terrestrial locomotive capabilities. Examples of underwater captures include any submersive autonomous or manned vehicle that can capture in any body of water. Cosmic captures, captures taken from space, can be taken by satellites, or manned and unmanned vehicles. Underground captures can be taken by various imaging techniques that are suitably used there.

3D data that can be used in the processes herein can also include polygon meshes. A polygon mesh is a collection of vertices, edges, and faces that defines the shape of a polyhedral object in 3d computer graphics and solid modeling. The faces usually consist of triangles, quadrilaterals, or other simple complex polygons since such presentations simplify rendering, but may also be composed of more general concave polygons, or polygons having holes.

Further 3D data from which wireframe renderings can be derived includes vector data models. A vector data model is representation of a scene using points, lines, and polygons.

In further aspects, the methods can further include the step of cross validating the generated boundaries and polygon edges by projecting them back into images and verifying the existence of dominant edges in the neighborhood. This could be applicable if the point cloud is generated using image-based reconstruction techniques so as to perform a confirmation step in relation to the original images from which the wireframe was derived.

The generated wireframe renderings can be used to process a combination of 2D image data and 3D spatial data in order to provide training data for machine learning, image processing, and other types of algorithms. For example, generated wireframe renderings can provide accurate representations of the locations where the vertices, edges, and planes are on the surface of the structure of interest. This information can be used to determine the locations of the corners of structures in 2D image data and 3D spatial data. Corners are defined mathematically by the locations where edges intersect, or otherwise known as the vertices. The wireframe renderings can be used to provide both labeled data in 3D space that are known to be edges, vertices, or planes and labeled pixels in 2D images that are the corresponding projected versions of the identified vertices, edges, or planes which can then be used for supervised, semi-supervised and unsupervised learning purposes.

Further with respect to the inclusion of machine learning operations to at least some of the generated wireframe renderings, machine learning models can be trained on features generated from object structures in order to learn information about said structures. This data can include but is not limited to images, drawings, point cloud data, wireframes, amongst others. Features in this case can be defined as a scalar or vector value objects estimated directly from the structures or indirectly by applying an algorithm or function on the structure or data related to the structure to generate features. Furthermore, features can be concatenated with other features (either scalar or vector) in order to produce larger feature vectors. Each element in the feature vector represents a feature dimension. A feature dimension can be defined by either an estimated feature (e.g., histogram of gradients, distribution of 3D normals, etc.) or a value directly borrowed from the structure (e.g., positions, dimensions, etc.). Algorithms, like machine learning algorithms, trained on these feature vectors can learn common structures (e.g., the graph defining their connections), common patterns found in like structures or scenes and their discrete properties like their type and shape or continuous properties like their dimensions and angles. Furthermore, knowledge gained from said algorithms can be utilized by model-driven methods to refine the estimates of the continuous or discrete valued properties.

Machine learning models can also be trained on features gathered from annotated data about a scene. This data can include but is not limited to images, data-interchange formats JSON, XML, YAML), BIM models (i.e. DWG, DXF, IFC, RVT, NWD), or any other automatically or user generated file with information about a scene. Features in this case are defined as but not limited to scalar, vector, label, proximity, and/or count objects. Features may be read directly from these files or generated indirectly from the application of additional algorithms and/or combinations of features. Algorithms, like machine learning algorithms, trained on these feature vectors can learn common structures (e.g., the graph defining their connections), common patterns found in like structures or scenes and their discrete properties like their type and shape or continuous properties like their dimensions and angles. Furthermore, knowledge gained from said algorithms can be utilized by model-driven methods to refine the estimates of the continuous or discrete valued properties.

Machine learning models can be trained on features generated from BIM models in order to learn and prediction information about said models. Information such as BIM models and the like can be fed into machine learning models for additional analysis including but not limited to outlier analysis, similarity analysis, areas of interest, areas that require inspection, and the like. This seed information may be provided from an outside source or may have been created by the present invention at any point in the process. For example, a BIM model of a room may be processed by a machine learning model which is able to make predictions about the availability of enough electricity to the room based on the power supply, availability of outlets, and necessity of objects found inside the room.

Machine learning algorithms along with computer vision algorithms can be applied to images and camera parameter information to generate 3D information. This 3D information can be used for, but is not limited to, determining vertices and edges of a structure which can be combined to create a wireframe of the object. This output can include 3D information, 2D information, and semantic information about both. This output can also be used as seed input for other parts of the invention.

Tuning of 3D information generated according to the processes herein can increase its value in downstream applications, such as for use in object libraries. Such tuning can be accomplished through machine learning methods, model-driven methods and a combination of both. Tuning or refinement can be considered the act of converging on a more precise value of a continuous property like dimensions or angles and/or discrete properties such as labels, groupings, or existence.

Machine learning algorithms can be applied to the generated wireframe renderings in order to tune them in well-known structures. Various layers of logic can be incorporated into these algorithms, where each layer can return different information about the structure. By providing different predictions, the algorithm can indicate whether sections of the wireframe that do not fit into conventional object shapes, sizes, or angles are to be altered, flagged, or removed based on some criteria for example the prediction of the algorithm. Furthermore, the algorithm can indicate the need to apply additional processing steps to the generated wireframe.

Model-driven methods, when applied to generated wireframe renderings generated by identification, isolation, resolving or segmenting of geometric primitives selected from the list of Table 1, can return robust estimates of continuous property types such as generated from measures on dimensions or discrete property types such as label, group, or existence. These methods can require an initial condition, in the case of the wireframe renderings, these can include an intermittent definition of the structure, pose, dimensions, and angles. The aforementioned values can be provided by the disclosed invention or a machine learning algorithm trained on the output from the disclosed invention or variant thereof. Once the model-driven algorithm is initiated, it is activated with each iteration updating its estimate of the valued property and optimizing the objective function that drives it. Definition of the objective function involves determining the properties to be optimized which can be directly measured from the provided 2D and/or 3D data or some information derived from these.

The machine learning models can also be tuned through continuous learning of parameters and hyper-parameters from any number of sources including but not limited to their own output, user based input, input from outside data sources, parameters from previously trained machine learning models. This tuning can include but is not limited to updates to weights used in models, updates to hyper-parameters used in training or prediction of models, updates to information fed into training of models, and/or updates to the combination of results of models commonly known as an ensemble of models.

Again, tuning can be accomplished through a combination of both model-driven and machine learning methods. By defining the objective function based on extracted or transformed information from the input 2D, 3D, or both types of data the benefits of the combination of the machine learning and model-driven method can be obtained. Examples of such benefits can include more robust estimates of the continuous or discrete level properties or better defined structures like the estimates of the vertices, edges and planes of which the wireframe is comprised or labels, groups, and counts of objects appearing in a scene Machine learning algorithms can be trained on images to learn what parts of structures look like their 2D projected form or in their 3D spatial form in order to more accurately capture the wireframe rendering of the structure. A machine learning algorithm may be trained on common instances of patterns of objects in order to learn how to discriminate them from other objects. These algorithms can then be applied to image data of the original structure from which the wireframe rendering was generated. This serves as another example of the extracted information from the input data that can drive the model-driven method or any algorithm tuning the wireframe. The predictions of the algorithms can be used to add vertices, remove vertices, adjust vertices, add edges, remove edges, add labels, or flag a vertex for further observation or processing based on some criteria.

Machine learning methods can be trained on structures and their corresponding 2D and 3D data in order to learn a direct relation between them. Thus, predicted wireframe structures can be estimated directly from the input 2D and/or 3D data. These serve as initial conditions for refinement or, if the conditions of the objective function is met, can be taken as direct estimates of the wireframe.

Machine learning methods can return semantic information about the structure of interest. Vertices, edges and planes in the wireframe are the graph and geometric properties that define the surface structure and shape. However, additional information can be extracted from the 3D and/or 2D data about them. For example, information about their composition, material, function, or relation to the environment. Machine learning algorithms can be trained on annotated versions of the data used to generate the wireframe to learn cues in the appearance or extracted features of the data that would allow them to make predictions about the semantic information. For example, with respect to roofs, they can identify planes with penetrations, the tiles of the roof, roofing composition (type or material), gutters, or possibly occluding objects like trees, facades, windows, doors, and any other objects of interest.

Machine learning models can be applied at any point in the current invention including but not limited to the initial seed point, full scale tuning of all results, fine tuning of a single piece of data in the result at any point in the process or anywhere and at any scale in between.

Machine learning models can be swapped, changed, or modified based on a content aware pipeline of where the invention is in its process, what content was submitted including what type of data and/or context about what the data is describing i.e., roof, façade, entire structure, outdoor scene, indoor scene, amongst others), and/or the preferred results (i.e., expected number of false positives, false negatives, or other potentially modifiable outcomes). This can include, but is not limited to, different model weights based on what is expected to be found in a scene, different models or different numbers of models being applied based on what is expected to be found in the scene or what data is provided, different amounts of outputs based on what is thought to be of interest or what data is provided, and/or different hyperparameters based on the scrutiny of results expected. For example, a machine learning model for a roof structure might be significantly different from models for a building interior scene in terms of model weights, number of models, output types, and the like. Therefore, such a priori information about the scene types and it functions could help in selecting the most optimum machine learning model and hence achieving the most desired outcome.

Information such as V/R and/or A/R scenes and the like can be input into machine learning for additional analysis such as object detection, object grouping, areas of interest, and/or areas for inspection, amongst others. This seed information may be provided from an outside source or may have been created by the present invention at any point in the process. For example, A/R scene data of a construction site may be input into a machine learning model to determine areas that have been changed recently but have not been inspected based on available data which would inform the necessary parties that an inspection and may be able to determine what objects require inspection, what types of inspections may be necessary, and/or who would be best to do the work.

Determining if an object is obstructing the view and possibly inducing error in the wireframe estimate can be highly relevant to the results. The disclosed invention generated wireframe renderings having accuracy can be dependent, at least in part, on the 2D and/or 3D data used as the input data. Error can be incurred if such input data is occluded or if noise is present. Machine learning methods can be trained to identify these instances of occlusion and noise presence and return informative indicators of their presence. Furthermore, they can be used to train other algorithms which can return confidence measures for the wireframe or can provide additional information to the tuning algorithms that would allow them to compensate for the occlusions and noise.

Still further, probabilistic and semantic based modeling can be incorporated into the evaluation of the generated wireframe renderings to modify the generated surface boundaries such that its conformity to the actual element or structure is improved. Yet further, a report could be generated based on all or part of the metadata extractable from the wireframe such as surface areas, sematic attributes like ridge, gutter, gable, convex and concave, material estimation, cost estimation, volume estimation, direction of the surfaces with respect to sun, total time for sun exposure during the day, volume of the structure, etc.

The methods herein can allow substantially accurate measurements and other dimensional aspects of the features or components of interest to be derived automatically from the 3D data to generate, for example, one or more wireframe renderings for use in a wide variety of downstream applications where accurate dimensional information, geometric information, or topographical information about one or more structures of interest in a scene may be useful.

As more specific, but non-limiting, examples of uses for the wireframes herein, inventorying, construction, merchandising, insurance underwriting and claim adjustment, civil engineering, architecture and design, building information management, home remodeling, roofing, flooring, real estate listing, gaming, mixed reality, virtual reality, augmented reality, among other things.

With regard specifically to BIM applications, as would be recognized, BIM is a digital representation of physical and functional characteristics of a facility, building, space, etc., which will necessarily incorporate information about objects present therein. A BIM is a shared knowledge resource for information about a facility forming a reliable basis for decisions during its life-cycle; defined as existing from earnest conception to demolition. BIM involves representing a design as combinations of "objects"—vague and undefined, generic or product-specific, solid shapes or void-space oriented (like the shape of a cone or more), that carry their geometry, relations and attributes. BIM design tools allow extraction of different views from a building model for drawing production and other uses. These different views can be made automatically consistent, being based on a single definition of each object instance. BIM software also endeavors to define objects parametrically; that is, the objects are defined as parameters and relations to other objects, so that if a related object is amended, dependent ones will automatically also change. For the professionals involved in a project, BIM enables a virtual information model to be handed from the architect or design team to the main contractor and subcontractors and then on to the owner/operator; each professional adds discipline-specific data to the single shared model. This seeks to reduce information losses that traditionally occurred when a new team takes 'ownership' of the project, and provides more extensive information to owners of complex structures.

When used in the BIM context, the systems and methods of the present invention can suitably be used to generate information about the object(s) present in a facility, where such objects comprise infrastructure, fixtures, materials, utilities, features, components, and the like. The generated measurements, dimensions, geometries, topography, labeling, and semantic information can be utilized to provide a deep and relevant collection of information set about a building or facility, where such collection can be used in BIM applications. Information can be generated in accordance with the methodology herein for use of each part of a building structure for which BIM can be relevant, for example, CAD design, structural analysis, detailing, HVAC, plumbing, electrical, interior finishes, and the like.

Moreover, the methods herein can be used in lifecycle management of a facility, scene, or site in that the presence, absence, or modification of previously identified objects etc. can be tracked over time as part of the BIM application. For example, the progression assembly of various infrastructure within a facility can be tracked in changes in the measurement, dimensions or topology of information returned can be monitored in time. The automated, or semi-automated nature of the methodology herein can reduce the need for in-person monitoring of the facilities and, as such, BIM applications can be enhanced.

Semantic information can be used in accordance with the methodology herein provides improvements in BIM applications. For example, if an object is identified as an HVAC system, for example, further information about that HVAC system can be generated when such further information is available in one or more libraries of data associated. For example, the original design drawings for that HVAC system can be available, as well as any service records, warranty information, parts lists, etc.

In the context of M/R (mixed reality), which includes A/R and V/R, augmented reality (AR) can be combined with BIM, as well as other applications provides a real-time view of a physical, real-world environment in which the view is augmented with computer-generated virtual elements, which may include sound, video, graphics and/or positioning data. Some mobile computing devices provide augmented reality applications that allow users to see an augmented view of a surrounding real-world environment through a camera of the mobile computing device. One such application overlays the camera view of the surrounding environment with location-based data, such as local shops, restaurants and movie theaters. Incorporation of the methodology herein in conjunction with A/R can enhance current applications such as by allowing the information extracted from the scenes to be better utilized. Creating the digital content for the A/R application is only part of the challenge. Positioning the digital overlay in the camera view is another challenge that can be overcome with this methodology. This application can generate dynamic feature points in any scene to recognize where the A/R objects should be in the view. Today, this may be done with GPS, registration targets, or other computer vision technique. However, the ability to better recognize specific objects provides more accurate spatial intelligence to overlay the A/R objects to improve user experience and interface. This level of accurate spatial intelligence can transform A/R applications from location-based consumer-focused overlays to more commercial applications focused on proving visualizations for training and educating engineers, designers, architects, and construction workers.

The systems and methods herein can further be used in virtual reality applications. As would be recognized "virtual reality" is the term used to describe a three-dimensional, computer generated environment which can be explored and interacted with by a person. That person becomes part of this virtual world or is immersed within this environment and whilst there, is able to manipulate objects or perform a series of actions. The information generated herein can be used to improve the quality of virtual reality environments. Today, creating a V/R environment is extremely time consuming and takes hours or days of manual effort. With the ability to automatically detect, identify, and extract 2D/3D objects the time and effort to create a V/R environment of the physical world is drastically reduced. Whether it is a 3D model with extracted objects or the ability to stitch together images to create an immersive digital model, the methodology herein can be used to modify or transform how content for V/R environments is created/generated. These types of immersive models can be used for but not limited to videogames, real estate walkthroughs, and training/educational programs for commercial and industrial applications. Most importantly, this application makes it possible for any consumer or commercial user to automatically generate an immersive V/R model from any passive or active sensor device.

The systems and methods herein can further be used in gaming applications. As would be recognized "gaming", or "video gaming", is the term used to describe a game played by electronically manipulating images produced by a computer program on a television screen or other display screen. Types of video games include massively multiplayer online (MMO), simulations, first person shooter (FPS), action, stealth shooter, educational, and other game types. Today, creating a gaming environment is extremely time consuming and takes hours or weeks or months of data collection and programming by the game developer. There is an interest in providing the user, or gamer, with the ability to bring their own location information, or local scene data into the gaming environment, simulating the game taking place in their room or home or street. This experience could be considered a fully immersive video game experience. In this game experience, the player's scene could be combined or integrated with the game developer-created scene, or replace it entirely, and the experience would seem like it takes place in the gamer's scene, e.g., his or her room. The room or aspects or objects from the room could be integrated or included in the gaming experience. With the ability to automatically detect, identify, and extract 2D/3D objects and provide semantic information about the objects using a passive camera the inventive technology could enable this immersive gaming experience. The game would need a predetermined interface definition in which scene information is described, since the game actions would rely on interacting with aspects of, or objects, in the scene. This interface can be a specification of data content and format and electronic method for exchanging the data. It can be assumed that this interface would include basic scene data such as geometry, volume, structure, and appearance. It would also include descriptive information about relevant objects in the scene, including what they are, topology and where the objects exist in the scene and relative to each other, geometry, volume and appearance. Examples of gaming actions benefiting from object specific information include doors and openings in which the game allows passage of the user or other characters or objects, windows in which the user could see through or could be broken or opened or other actions of a window, or a cup of liquid on a table in which the game could cause it to fall over or enable the user or character to pick it up. Additionally, semantic information provided by the inventive system can enable the game developer to build more powerful functionality into interaction with the objects, such as weight and whether an object is movable or force required to move it, the material from which the object is made and how it should appear or react to force applied to it, or material and whether it should bounce or break. These are just representative examples but there are endless benefits from identifying objects and detailed information about the objects in the scene. There is great value in a gamer being able to bring their scene into the game environment using just a passive camera. The inventive technology could be built into the passive camera or into the game console or game controller to enable this functionality.

Yet further, the systems and methods can be used to create inventories of objects, such as furniture or components of value that are present in a facility or similar environment. For example, information about high value components, such as automobiles can be generated from a scene. In this regard, the number and type of automobiles present in a storage lot can be generated using the methodology herein.

Surveying operations can benefit from the inventive technology. With all the advances in autonomous vehicle navigation, there is a need for well-defined maps of both populated and unpopulated areas. There is already a series of literature as far as detection of objects for the purpose of obstacle avoidance and safety. However, there remains a need for recreating the space around a moving vehicle with both geometric, topological and semantic information, for example. In this regard, the present invention can allow accurate wireframe renderings of an area or location proximate to a vehicle of interest in a scene, thereby allowing the location of the vehicle to be accurately placed in the scene. In some implementations, a plurality of wireframe renderings can be generated, in which topological information or other relevant information is incorporated therein for various aspects of the scene, including, but not limited to, the location of the vehicle relative to other structures or objects in the scene.

The inventive methodology can also aid in object avoidance for autonomous driving and drones. Recreating a scene and knowing the objects that occupy in that scene is a complex process that will greatly aid in the ability for autonomous vehicles to navigate safely and effectively.

The inventive methodology can also aid in navigating in an unknown environment. Navigating an unknown environment can be a time-consuming and potentially dangerous process. This technology can enable autonomous craft to explore the environment first and recreate the scene accurately and with context in order to provide a clear means of navigation.

Still further, the inventive methodology can help first responders to navigate in an unknown place, a collapsed structure, or find people unable to respond. These situations can often be dangerous and full of confusion. By leveraging this technology an autonomous craft can be sent in to navigate any unknown areas, find paths through structures which may have collapsed or become damaged, provide semantic information about damage, and detect people or animals which may be in need.

As additional applications, the wireframes and related information generated herein can be used to generate takeoff information and construction estimations, as well as building images, CAD drawings, site plans, architectural drawings, building information models, scale drawings of a building or structure, landscape plans, interior design plans, inventory management plans, virtual tours, input into virtual reality content creation engines, gaming interfaces, etc.

In conjunction with the methods herein, in some aspects, the software associated with the image capture device and/or the hardware into which the image capture device is integrated is configured to provide the user with interactive feedback with regard to the image-acquisition parameters and/or the structure selection process. For example, in some aspects, such interactive feedback provides information regarding the object of interest including whether the tracking is suitable to obtain a plurality of overlapping 2D images necessary to provide suitable images for use herein. In some aspects, such processing is conducted in the image capture device itself or the hardware in which the device is integrated (e.g., smartphone, wearable device etc.). In other aspects, the processing is performed "in the cloud" on a server that is in communication with the image capture device/hardware. In other aspects, the processing is performed on any device in communication with the image capture device and/or hardware. In some aspects, such processing is performed on both the device/hardware and an associated server, where decision-making regarding the location of various parts of the processing may depend on the speed and quality that the user needs results. Yet further, in some aspects, user feedback is provided in real time, in near real time or on a delayed basis.

Yet further, in some aspects, the user display of the output herein thereof is configured to provide user generated inputs to facilitate and enhance generation of the plurality of 2D images, the point clouds, and any derived wireframe renderings or the like. In some aspects, such user generated inputs can include, for example, the level of detail, a close-up of a portion of the object(s) of interest and any associated image or generated point cloud, optional colorization, a desirable level dimension detail, etc.

In a further aspect, the software associated with the image capture devices and methods herein is configured to provide an accuracy value for the generated measurements, dimensions, topology, labels, semantics etc. By reporting a level of accuracy (where such accuracy is derivable as set out elsewhere herein), a user will obtain knowledge about accuracy of the extracted measurement or other dimensional value, or a probability that the returned label and/or semantic information is accurate with respect to the one or more structures of interest.

In some aspects, the software associated with the image capture devices and/or hardware in which the image capture device is integrated is configured to elicit and receive from the user a selection of a region/area of interest in a captured image(s) of the object of interest from which point clouds and generated are derived. For example, in some aspects, when a scene in which one or more structures of interest is captured, the software elicits and receives selection of specific object(s) that are recognized in the scene or for which other information can be provided (e.g., measurements, dimensions, topology, labels, semantics). In this regard, the software can return a query to the user that asks him to confirm that a recognized object(s) is of interest. If the user affirms that the indicated object(s) is of interest, further information about the object can be returned. In an exemplary configuration of such an implementation, the scene presented to the user through a viewfinder or screen on the image capture device elicits and receives the selection of an object present in the scene such as by touch or other type of method. The object of interest can be provided for selection by a computer or a user.

In some aspects, the methods of the present invention are suitable for use, and are performed, "in the cloud" (i.e., the software executes on server computers connected to the internet and leased on an as-needed basis). (Note that the word "cloud" as used in the terms "point cloud" described as part of the invention is independent of, and unrelated to, "cloud computing" as such.) As would recognized, cloud computing has emerged as one optimization of traditional data processing methodologies. A computing cloud is defined as a set of resources (e.g., processing, storage, or other resources) available through a network that can serve at least some traditional data center functions for an enterprise. A computing cloud often involves a layer of abstraction such that the applications and users of the computing cloud may not know the specific hardware that the applications are running on, where the hardware is located, and so forth. This allows the computing cloud operator some additional freedom in terms of implementing resources into and out of service, maintenance, and so on. Computing clouds may include public computing clouds, such as Microsoft® Azure, Amazon® Web Services, and others, as well as private computing clouds.

Communication media appropriate for use in or with the inventions of the present invention may be exemplified by computer-readable instructions, data structures, program modules, or other data stored on non-transient computer-readable media, and may include any information-delivery media. The instructions and data structures stored on the non-transient computer-readable media may be transmitted as a modulated data signal to the computer or server on which the computer-implemented methods of the present invention are executed. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term "computer-readable media" as used herein may include both local non-transient storage media and remote non-transient storage media connected to the information processors using communication media such as the internet. Non-transient computer-readable media do not include mere signals or modulated carrier waves, but include the storage media that form the source for such signals.

At this time, there is little distinction left between hardware and software implementations of aspects of systems; the use of hardware or software is generally (but not always, in that in certain contexts the choice between hardware and software can become significant) a design choice representing cost vs. efficiency tradeoffs. There are various information-processing vehicles by which processes and/or systems and/or other technologies described herein may be implemented, e.g., hardware, software, and/or firmware, and that the preferred vehicle may vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various aspects of the devices and/or processes for system configuration via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the aspects disclosed herein, in whole or in part, can be equivalently implemented in integrated circuits, as one or more computer programs running on one or more computers, e.g., as one or more programs running on one or more computer systems, as one or more programs running on one or more processors, e.g., as one or more programs running on one or more microprocessors, as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal-bearing medium include, but are not limited to, the following: a recordable type medium such as a floppy disk, a hard disk drive, a CD, a DVD, a digital tape, a computer memory, etc.; and a remote non-transitory storage medium accessed using a transmission type medium such as a digital and/or an analog communication medium (e.g., a fiber optic cable, a waveguide, a wired communications link, a wireless communication link, etc.), for example a server accessed via the internet.

Those skilled in the art will recognize that it is common within the art to describe devices and/or processes in the fashion set forth herein, and thereafter use engineering practices to integrate such described devices and/or processes into data-processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors, e.g., feedback for sensing position and/or velocity; control motors for moving and/or adjusting components and/or quantities. A typical data processing system may be implemented utilizing any suitable commercially available components, such as those typically found in data computing/communication and/or network computing/communication systems.

The herein-described subject matter sometimes illustrates different components contained within, or connected with, different other components. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

As described above, the exemplary aspects have been described and illustrated in the drawings and the specification. The exemplary aspects were chosen and described in order to explain certain principles of the invention and their practical application, to thereby enable others skilled in the art to make and utilize various exemplary aspects of the present invention, as well as various alternatives and modifications thereof. As is evident from the foregoing description, certain aspects of the present invention are not limited by the particular details of the examples illustrated herein, and it is therefore contemplated that other modifications and applications, or equivalents thereof, will occur to those skilled in the art. Many changes, modifications, variations and other uses and applications of the present construction will, however, become apparent to those skilled in the art after considering the specification and the accompanying drawings. All such changes, modifications, variations and other uses and applications which do not depart from the spirit and scope of the invention are deemed to be covered by the invention which is limited only by the claims as will be presented.

What is claimed is:

1. A method of generating wireframe rendering of at least one structure of interest in a scene comprising:
   a. providing, automatically by a computer, 2D and 3D data for at least one structure of interest in a scene;
   b. processing, automatically by the computer, the 2D and 3D data to generate 3D information comprising an edge or skeletal representation associated with the at least one structure of interest, wherein the 2D and 3D data comprising the at least one structure of interest in the scene is generated by:
      i. providing a plurality of 2D images including the at least one structure of interest and at least one point cloud including the at least one structure of interest, wherein the plurality of 2D images are associated with the at least one point cloud; or
      ii. processing a plurality of point clouds to extract at least some 2D data associated with the at least one structure of interest, thereby providing point cloud data associated with 2D data derived from the plurality of point clouds; and
   c. extracting, automatically by a computer, at least one geometric primitive from the 3D information comprising the edge or skeletal representation, each of the at least one geometric primitive being an object surface of the at least one structure of interest, wherein each extracted geometric primitive, independently, is selected from a list of geometric primitives in Table 1:

TABLE 1

| No. | Type | Canonical Expression |
|---|---|---|
| 1 | One real plane | $ax + by + cz + d = 0$ |
| 2 | Ellipsoid | $x^2/a + y^2/b + z^2/c = 1$ |
| 3 | Elliptic cylinder | $x^2/a + y^2/b = 1$ |
| 4 | Hyperbolic cylinder | $x^2/a - y^2/b = 1$ |
| 5 | Parabolic cylinder | $x^2 + 2y = 0$ |
| 6 | Quadric cone | $x^2/a + y^2/b - z^2/c = 0$ |
| 7 | Hyperboloid of one sheet | $x^2/a + y^2/b - z^2/c = 1$ |
| 8 | Hyperboloid of two sheets | $x^2/a + y^2/b - z^2/c = -1$ |
| 9 | Hyperbolic paraboloid | $x^2/a - y^2/b + 2z = 0$ |
| 10 | Elliptic paraboloid | $x^2/a - y^2/b + 2z = 0$ |
| 11 | Intersecting planes | $x^2/a - y^2/b = 0$ |
| 12 | Parallel planes | $x^2 = 1$ | and
   d. processing, automatically by the computer, output from step c to provide a wireframe rendering of at least part of the at least one structure of interest in the scene, the processing comprising:
      determining edges of the object surfaces;
      determining intersections and spatial relationships between intersecting object surfaces;
      resolving edges of the object surfaces based at least in part upon the intersections, the spatial relationships, and the plurality of 2D images; and
      combining the resolved object surfaces to generate the wireframe rendering.

2. The method of claim 1, wherein the at least one structure of interest comprises at least one structural element that comprises a non-planar surface.

3. The method of claim 1, wherein:
   a. The at least one structure of interest has an actual measurement value, actual dimensions, and actual geometric information;
   b. one or more of measurement information, dimensions, and geometric information for the at least one structure of interest is or are derived from the wireframe rendering; and
   c. each of the derived measurement information, dimensions, and geometric information is, independently, within 5% or less of the corresponding actual measurement value, actual dimensions, and actual geometric information, thereby providing a numerically accurate wireframe rendering of at least part of the at least one structure of interest in the scene.

4. The method of claim 1, wherein semantic information is generated for the at least one structure of interest.

5. The method of claim 1, wherein the at least one structure of interest comprises a building exterior or a building interior.

6. The method of claim 1, wherein the at least one structure of interest comprises a roof, and the provided wireframe rendering is provided as part of a roofing report.

7. The method of claim 1, wherein at least two geometric primitives are extracted, and all or part of a first geometric primitive boundary is within a second geometric primitive boundary.

8. The method of claim 1, further comprising incorporating the wireframe rendering into a machine learning training set.

9. A method of generating wireframe rendering of at least one structure of interest in a scene comprising:
   a. providing 2D and 3D data for at least one structure of interest in a scene;
   b. processing the 2D and 3D data to generate 3D information comprising an edge or skeletal representation associated with the at least one structure of interest, wherein the 2D and 3D data comprising the at least one structure of interest in the scene is generated by:
      i. providing a plurality of 2D images including the at least one structure of interest and at least one point cloud including the at least one structure of interest, wherein the plurality of 2D images are associated with the at least one point cloud; or
      ii. processing a plurality of point clouds to extract at least some 2D data associated with the at least one structure of interest, thereby providing point cloud data associated with 2D data derived from the plurality of point clouds; and
   c. extracting a plurality of geometric primitives from the 3D information comprising the edge or skeletal representation, each of the plurality of geometric primitives being an object surface of the at least one structure of interest, wherein each extracted geometric primitive, independently, is selected from a list of geometric primitives in Table 1:

TABLE 1

| No. | Type | Canonical Expression |
|---|---|---|
| 1 | One real plane | $ax + by + cz + d = 0$ |
| 2 | Ellipsoid | $x^2/a + y^2/b + z^2/c = 1$ |
| 3 | Elliptic cylinder | $x^2/a + y^2/b = 1$ |
| 4 | Hyperbolic cylinder | $x^2/a - y^2/b = 1$ |
| 5 | Parabolic cylinder | $x^2 + 2y = 0$ |
| 6 | Quadric cone | $x^2/a + y^2/b - z^2/c = 0$ |
| 7 | Hyperboloid of one sheet | $x^2/a + y^2/b - z^2/c = 1$ |
| 8 | Hyperboloid of two sheets | $x^2/a + y^2/b - z^2/c = -1$ |
| 9 | Hyperbolic paraboloid | $x^2/a - y^2/b + 2z = 0$ |
| 10 | Elliptic paraboloid | $x^2/a - y^2/b + 2z = 0$ |
| 11 | Intersecting planes | $x^2/a - y^2/b = 0$ |
| 12 | Parallel planes | $x^2 = 1$ | and d. processing output from step c to provide a wireframe rendering of at least part of the at least one structure of interest in the scene, the processing comprising:

determining edges of the object surfaces;

determining intersections and spatial relationships between intersecting object surfaces;

resolving edges of the object surfaces based at least in part upon the intersections, the spatial relationships, and the plurality of 2D images; and combining the resolved object surfaces to generate the wireframe rendering, wherein:

i. the at least one structure of interest has an actual measurement value, actual dimensions, and actual geometric information;

ii. one or more of measurement information, dimensions, and geometric information for the at least one structure of interest is or are derived from the wireframe rendering; and iii. each of the derived measurement information, dimensions, and geometric information is, independently, within 5% or less of the corresponding actual measurement value, actual dimensions, and actual geometric information, thereby providing a numerically accurate wireframe rendering of at least part of the at least one structure of interest in the scene.

10. The method of claim 9, wherein each of the steps is performed by a computer, thereby providing an automatically generated wireframe rendering.

11. The method of claim 9, wherein the at least one structure of interest comprises at least one structural element that comprises a non-planar surface.

12. The method of claim 9, wherein at least two geometric primitives are extracted, and all or part of a first geometric primitive boundary is within a second geometric primitive boundary.

13. The method of claim 9, wherein semantic information is generated for the at least one structure of interest.

14. The method of claim 9, wherein the at least one structure of interest comprises a building exterior or a building interior.

15. The method of claim 9, wherein the at least one structure of interest comprises a roof, and the provided wireframe rendering is provided as part of a roofing report.

16. The method of claim 9, further comprising incorporating the wireframe rendering into a machine learning training set.

* * * * *